(12) United States Patent
Kobayashi

(10) Patent No.: US 12,412,870 B2
(45) Date of Patent: Sep. 9, 2025

(54) SEMICONDUCTOR MEMORY DEVICE AND METHOD OF MANUFACTURING THE SAME

(71) Applicant: Kioxia Corporation, Tokyo (JP)

(72) Inventor: Shinya Kobayashi, Taito (JP)

(73) Assignee: Kioxia Corporation, Tokyo (JP)

(*) Notice: Subject to any disclaimer, the term of this patent is extended or adjusted under 35 U.S.C. 154(b) by 602 days.

(21) Appl. No.: 17/811,654

(22) Filed: Jul. 11, 2022

(65) Prior Publication Data
US 2023/0197686 A1    Jun. 22, 2023

(30) Foreign Application Priority Data
Dec. 17, 2021    (JP) .................. 2021-205592

(51) Int. Cl.
    H01L 25/065    (2023.01)
    H01L 21/66    (2006.01)
    H01L 25/00    (2006.01)
    H01L 25/18    (2023.01)

(52) U.S. Cl.
    CPC .......... *H01L 25/0657* (2013.01); *H01L 22/20* (2013.01); *H01L 25/18* (2013.01); *H01L 25/50* (2013.01); *H01L 2225/06513* (2013.01); *H01L 2225/06527* (2013.01); *H01L 2225/06541* (2013.01); *H01L 2225/06586* (2013.01)

(58) Field of Classification Search
    CPC ...... H01L 25/0657; H01L 25/50; H01L 22/20
    See application file for complete search history.

(56) References Cited

U.S. PATENT DOCUMENTS

| | | | |
|---|---|---|---|
| 8,516,409 B2 * | 8/2013 | Coteus | H01L 25/0657 |
| | | | 716/101 |
| 10,403,635 B2 | 9/2019 | Fukuzumi et al. | |
| 10,497,688 B2 | 12/2019 | Tsukiyama et al. | |
| 10,964,671 B2 | 3/2021 | Koyanagi | |
| 11,417,642 B2 | 8/2022 | Sanuki et al. | |
| 2010/0161888 A1 * | 6/2010 | Eggleston | G11C 16/10 |
| | | | 711/E12.008 |
| 2020/0258924 A1 | 8/2020 | Takachi et al. | |
| 2021/0343737 A1 | 11/2021 | Utsumi | |

FOREIGN PATENT DOCUMENTS

| | | |
|---|---|---|
| TW | 202117878 A | 5/2021 |
| TW | 2021 35056 A | 9/2021 |
| WO | WO 2021/131388 A1 | 7/2021 |

* cited by examiner

*Primary Examiner* — Dale E Page
*Assistant Examiner* — Wilner Jean Baptiste
(74) *Attorney, Agent, or Firm* — Oblon, McClelland, Maier & Neustadt, L.L.P.

(57) ABSTRACT

A semiconductor memory device includes first and second memory devices arranged in a first direction, and a plurality of first bump electrodes disposed between the first and the second memory devices. Each of the first and the second memory devices includes a first chip including a memory cell array and a plurality of first electrodes, a second chip including a peripheral circuit and a plurality of second electrodes, and a plurality of second bump electrodes disposed between the first and the second chips. The plurality of first bump electrodes electrically connect the plurality of first electrodes to the plurality of second electrodes. The plurality of second bump electrodes electrically connect the memory cell array to the peripheral circuit in the first and the second memory devices.

10 Claims, 31 Drawing Sheets

SEMICONDUCTOR MEMORY DEVICE AND METHOD OF MANUFACTURING THE SAME

CROSS-REFERENCE TO RELATED APPLICATIONS

This application is based upon and claims the benefit of Japanese Patent Application No. 2021-205592, filed on Dec. 17, 2021, the entire contents of which are incorporated herein by reference.

BACKGROUND

Field

This embodiment relates to a semiconductor memory device and a method of manufacturing the same.

Description of the Related Art

A semiconductor memory device includes a first memory chip and a second memory chip, and the first memory chip is electrically connected to the second memory chip via a bump electrode.

DETAILED DESCRIPTION

Figure 1:
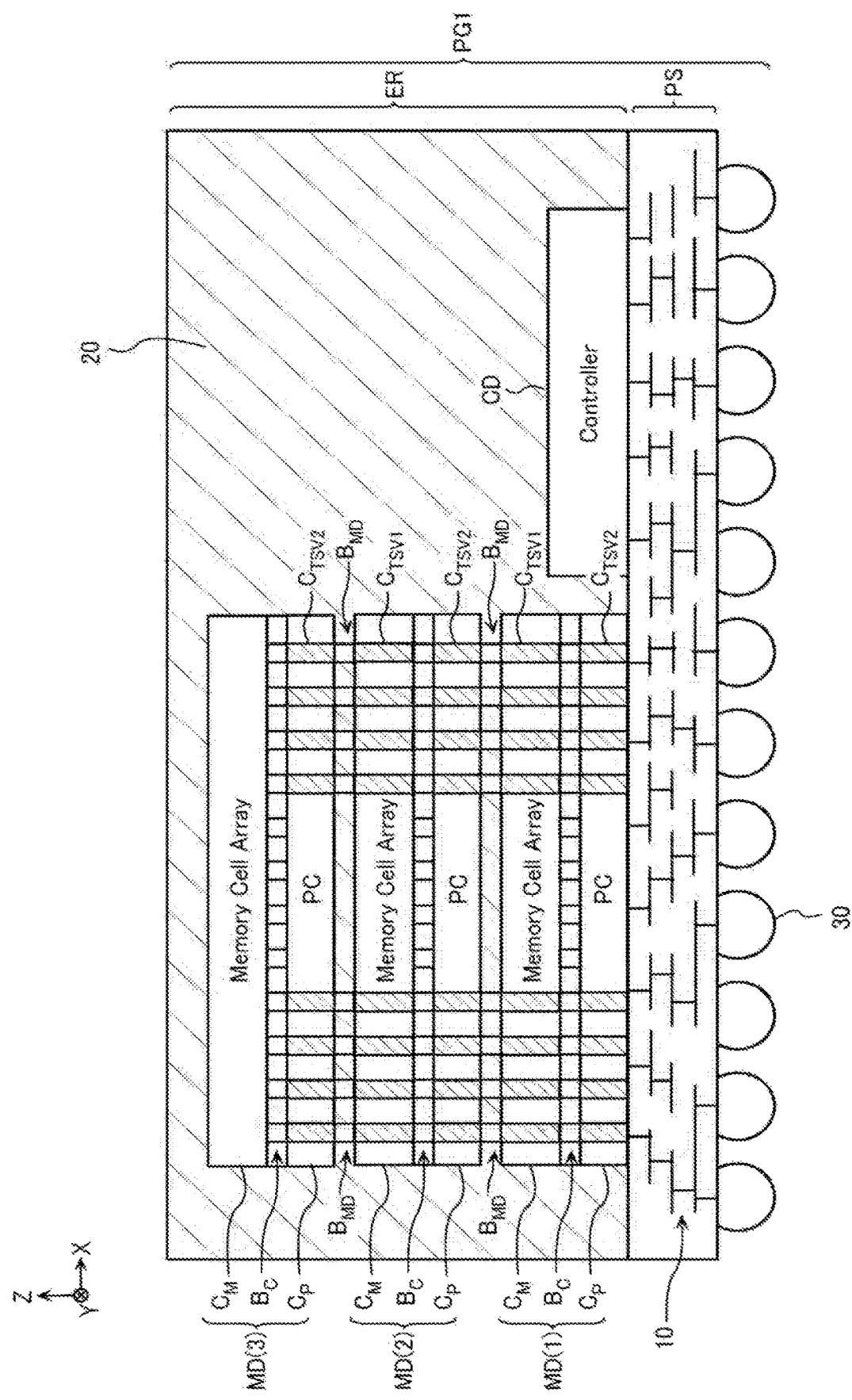
FIG. 1 is a schematic cross-sectional view of a semiconductor package PG1 according to a first embodiment.

A semiconductor memory device according to one embodiment comprises a first memory device and a second memory device arranged in a first direction, and a plurality of first bump electrodes disposed between the first memory device and the second memory device. Each of the first memory device and the second memory device includes a first chip including a memory cell array and a plurality of first electrodes, a second chip including a peripheral circuit and a plurality of second electrodes, and a plurality of second bump electrodes disposed between the first chip and the second chip. The first direction is a thickness direction of the first memory device and the second memory device. At least one of the plurality of first bump electrodes electrically connects at least one of the plurality of first electrodes included in the first memory device to at least one of the plurality of second electrodes included in the second memory device. In the first memory device and the second memory device, at least one of the plurality of second bump electrodes electrically connects the memory cell array to the peripheral circuit. The peripheral circuit of the first memory device is configured to be able to control the memory cell array of the first memory device. At least one of the plurality of second bump electrodes of the first memory device is disposed between the peripheral circuit of the first memory device and the memory cell array of the first memory device, and connects the peripheral circuit of the first memory device to the memory cell array of the first memory device in the first direction.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory device and may mean a memory system including a controller die, such as a memory card and a Solid State Drive (SSD). It may mean a semiconductor package. Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on a configuration of a package substrate or the like. For example, a direction away from the package substrate or the like along the Z-direction is referred to as above and a direction approaching the package substrate or the like along the Z-direction is referred to as below. A lower surface and a lower end portion of a certain configuration mean a surface and an end portion on the side of the package substrate or the like of this configuration. An upper surface and an upper end portion of a certain configuration mean a surface and an end portion on an opposite side of the package substrate or the like of this configuration. A surface intersecting with the X-direction or the Y-direction is referred to as a side surface and the like.

In this specification, when referring to a "width", a "length", a "thickness", or the like of a configuration, a member, or the like in a predetermined direction, this may mean a width, a length, a thickness, or the like in a cross-sectional surface or the like observed with a Scanning electron microscopy (SEM), a Transmission electron microscopy (TEM), or the like.

First Embodiment

[Configuration of Semiconductor Package PG1]

FIG. 1 is a schematic cross-sectional view of a semiconductor package PG1. The semiconductor package PG1 includes a package substrate PS, a plurality of memory devices MD, a controller die CD, a sealing resin 20, and a plurality of solder balls 30. In the example of FIG. 1, three memory devices MD(1), MD(2), and MD(3) are mounted to the package substrate PS. The semiconductor package PG1 includes bump electrodes $B_{MD}$ each disposed between the two memory devices MD. The Z-direction is a thickness direction of the memory device MD.

The package substrate PS includes a plurality of wirings 10. The plurality of wirings 10 electrically connect the memory devices MD, the controller die CD, external terminals, and the like. While not illustrated, electrodes that electrically connect the wirings 10 to the memory devices MD and the controller die CD are formed on an upper surface of the package substrate PS. The plurality of solder balls 30 are attached to a lower surface of the package substrate PS. The package substrate PS is electrically connected to, for example, a substrate of an electronic device via the solder balls 30.

The memory device MD includes a chip $C_M$ including a memory cell array and a chip $C_P$ including a peripheral circuit PC. The memory device MD includes bump electrodes $B_C$ disposed between the chip $C_M$ and the chip $C_P$.

The chip $C_M$ includes a plurality of first electrodes $C_{TSV1}$ extending in the Z-direction in the chip $C_M$. The chip $C_P$ includes a plurality of second electrodes $C_{TSV2}$ extending in the Z-direction in the chip $C_P$. In FIG. 1, the first electrodes $C_{TSV1}$ in the memory device MD(3) are not illustrated. However, the first electrodes $C_{TSV1}$ may be disposed in the chip $C_M$ of the memory device MD(3).

A plurality of the bump electrodes $B_C$ electrically connect the plurality of first electrodes $C_{TSV1}$ in the chip $C_M$ to the plurality of second electrodes $C_{TSV2}$ in the chip $C_P$. The plurality of bump electrodes $B_C$ electrically connect paths of the wirings and the like in the chip $C_M$ to paths of the wirings and the like in the chip $C_P$. Accordingly, a signal is transmitted between the memory cell array of the chip $C_M$ and the peripheral circuit PC of the chip $C_P$.

The controller die CD includes, for example, a processor, a RAM, a ROM, and an ECC circuit, and performs processes of a conversion between a logical address and a physical address, a bit error detection/correction, a wear leveling, and the like. The controller die CD inputs and outputs a data signal corresponding to read data and write data, an external control signal for controlling the peripheral circuit PC, and the like with the peripheral circuit PC of the chip $C_P$.

The plurality of bump electrodes $B_{MD}$ electrically connect the plurality of first electrodes $C_{TSV1}$ of the chip $C_M$ in one memory device (for example, memory device MD(1)) to the plurality of second electrodes $C_{TSV2}$ of the chip $C_P$ in another memory device (for example, memory device MD(2)). The plurality of bump electrodes $B_{MD}$ electrically connect paths of the wirings and the like in the one memory device MD(1) to paths of the wirings and the like in the other memory device MD(2). Accordingly, signals are transmitted among the plurality of memory devices MD.

The plurality of memory devices MD(1) to MD(3) are electrically connected to the controller die CD via these plurality of bump electrodes $B_{MD}$ and the wirings 10 of the package substrate PS. Accordingly, a signal is transmitted between the peripheral circuit PC of the chip $C_P$ and the controller die CD.

[Structure of Memory Device MD]

Figure 2:
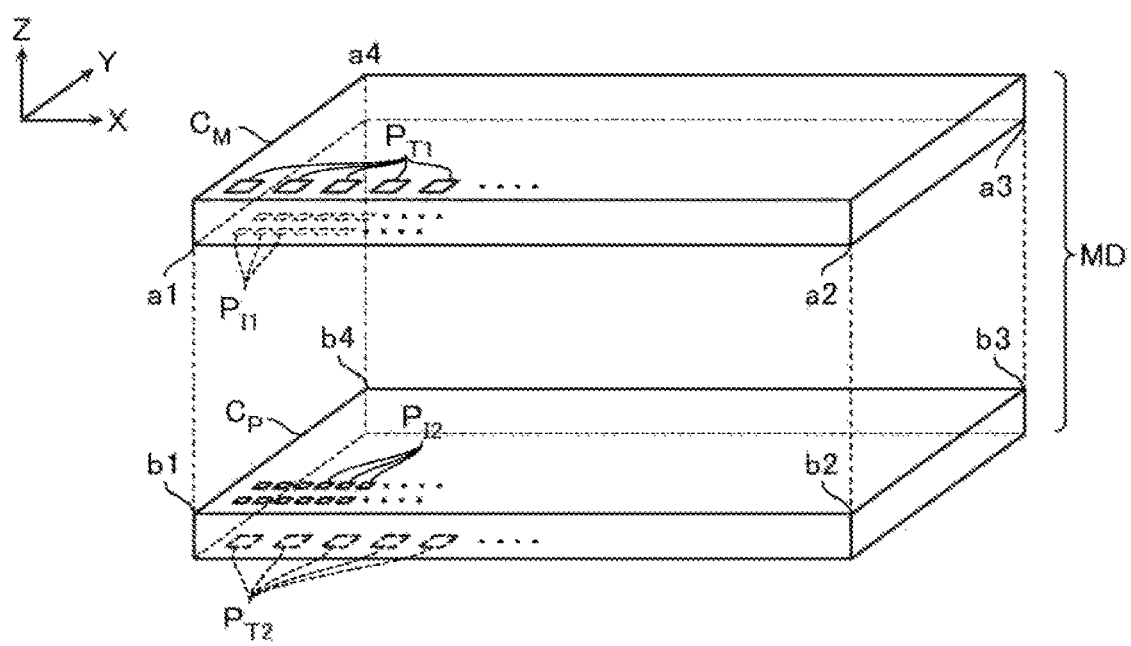
FIG. 2 is a schematic exploded perspective view illustrating an exemplary configuration of a memory device MD according to the first embodiment.

FIG. 2 is a schematic exploded perspective view illustrating an exemplary configuration of the memory device MD according to the first embodiment. As illustrated in FIG. 2, the memory device MD includes the chip $C_M$ in the memory cell array side and the chip $C_P$ in the peripheral circuit PC side. In FIG. 2, the plurality of bump electrodes $B_C$ and the plurality of bump electrodes $B_{MD}$ are omitted.

A plurality of first external electrodes $P_{T1}$ are disposed on an upper surface of the chip $C_M$. A plurality of first internal electrodes $P_{I1}$ are disposed on a lower surface of the chip $C_M$. A plurality of second internal electrodes $P_{I2}$ are disposed on an upper surface of the chip $C_P$. A plurality of second external electrodes $P_{T2}$ are disposed on a lower surface of the chip $C_P$. Hereinafter, for the chip $C_M$, the surface on which the plurality of first internal electrodes $P_{I1}$ are disposed is referred to as a front surface, and the surface on which the plurality of first external electrodes $P_{T1}$ are disposed is referred to as a back surface. For the chip $C_P$, the surface on which the plurality of second internal electrodes $P_{I2}$ are disposed is referred to as a front surface, and the surface on which the plurality of second external electrodes $P_{T2}$ are disposed is referred to as a back surface. In the illustrated example, the front surface of the chip $C_P$ is disposed above the back surface of the chip $C_P$, and the back surface of the chip $C_M$ is disposed above the front surface of the chip $C_M$.

The chip $C_M$ and the chip $C_P$ are arranged such that the front surface of the chip $C_M$ is opposed to the front surface of the chip $C_P$. The plurality of first internal electrodes $P_{I1}$ are disposed corresponding to the respective plurality of second internal electrodes $P_{I2}$, and arranged at positions connectable to the plurality of second internal electrodes $P_{I2}$. The first internal electrodes $P_{I1}$ and the second internal electrodes $P_{I2}$ electrically conduct the wirings and the like in the chip $C_M$ with the wirings and the like in the chip $C_P$ via the bump electrodes $B_C$.

The plurality of first external electrodes $P_{T1}$ in one memory device MD are disposed corresponding to the respective plurality of second external electrodes $P_{T2}$ in another memory device MD, and arranged at positions connectable to the plurality of second external electrodes $P_{T2}$ of the other memory device MD. The first external electrodes $P_{T1}$ and the second external electrodes $P_{T2}$ function as electrodes that electrically conduct the wirings and the like of the chip $C_M$ in the one memory device MD with the wirings and the like of the chip $C_P$ in the other memory device MD via the bump electrodes $B_{MD}$.

In the example of FIG. 2, corner portions a1, a2, a3, and a4 of the chip $C_M$ correspond to corner portions b1, b2, b3, and b4 of the chip $C_P$, respectively.

Figure 3:
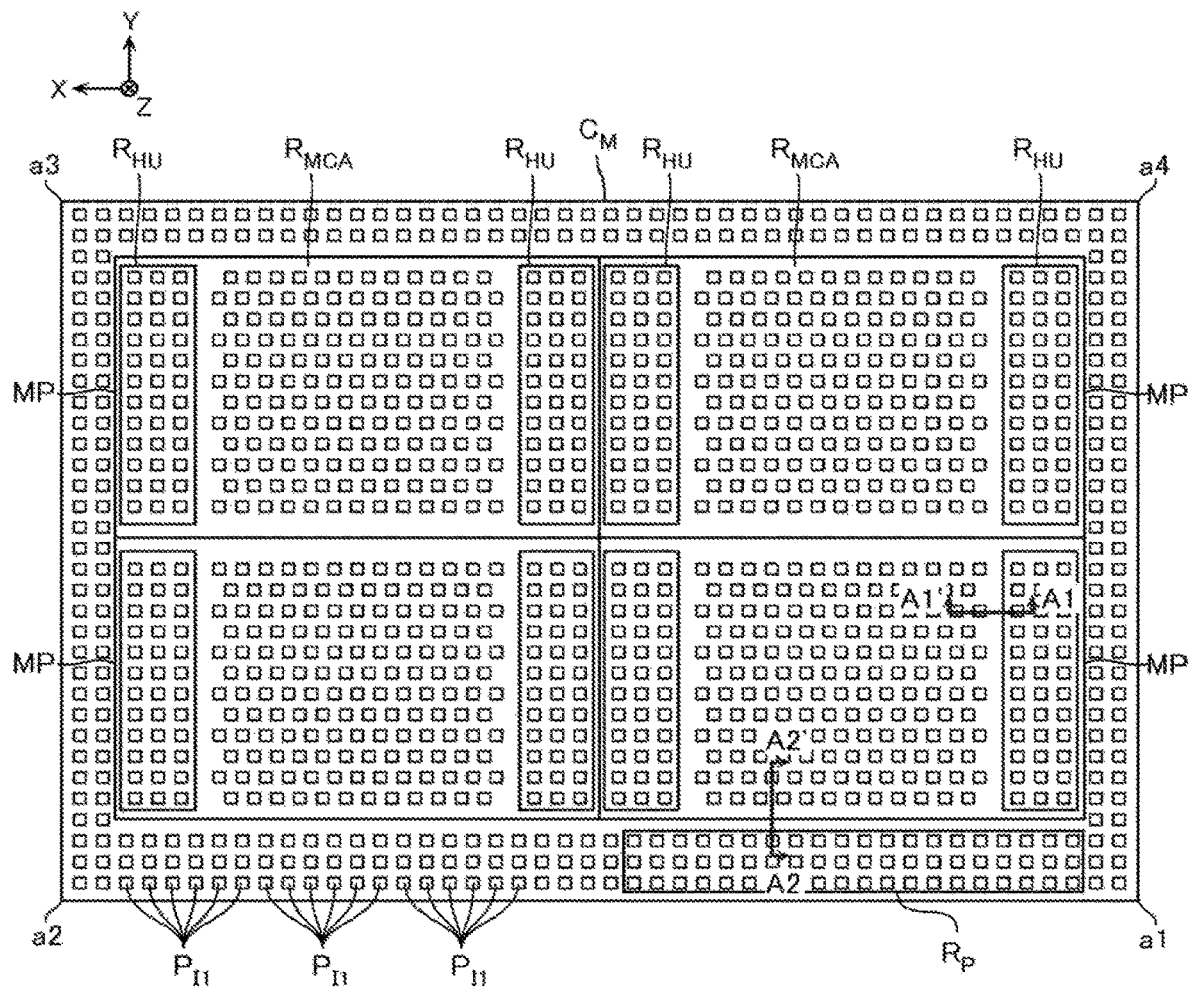
FIG. 3 is a schematic bottom view illustrating an exemplary configuration of a chip $C_M$.
Figure 4:
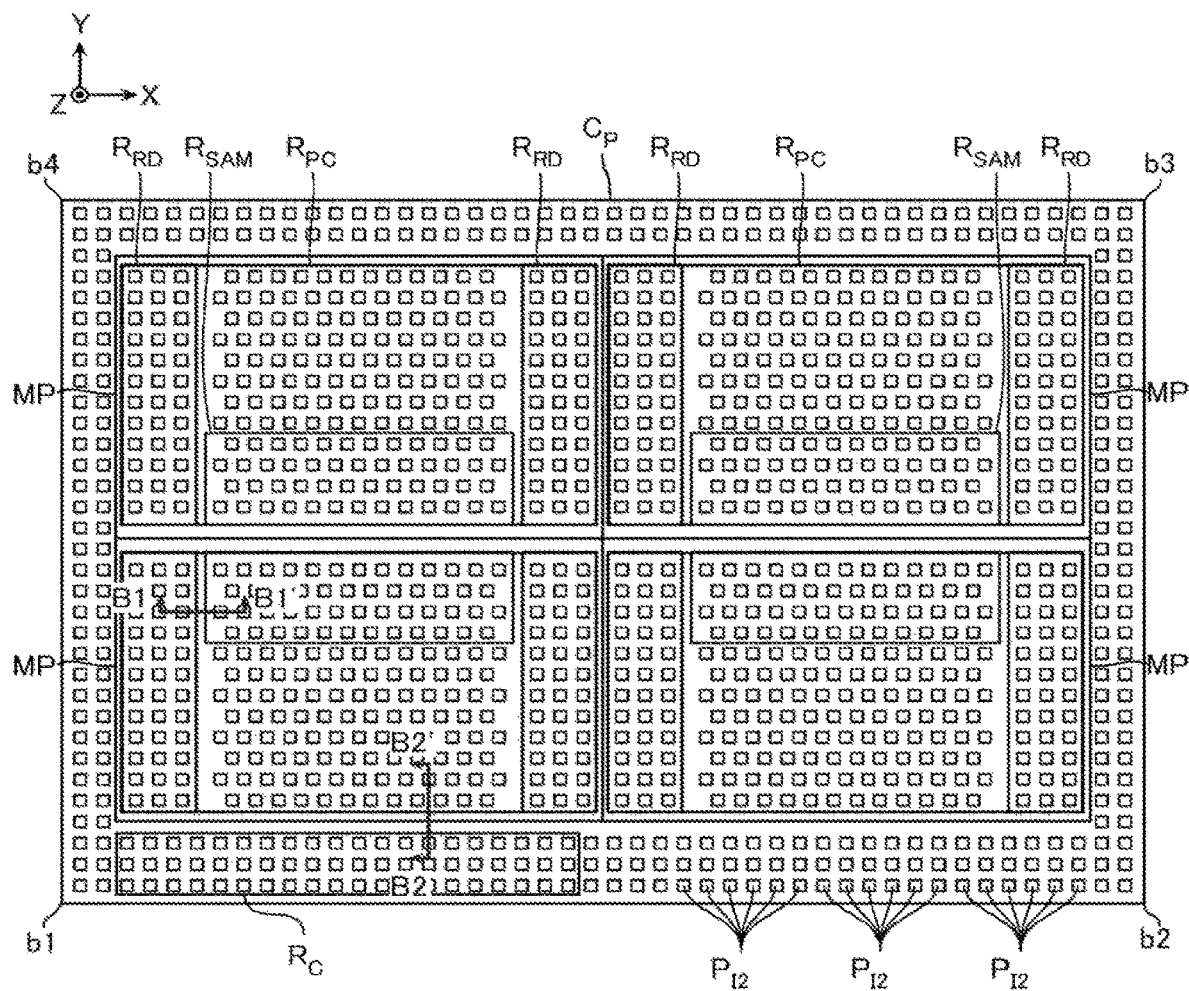
FIG. 4 is a schematic plan view illustrating an exemplary configuration of a chip $C_P$.
Figure 5:
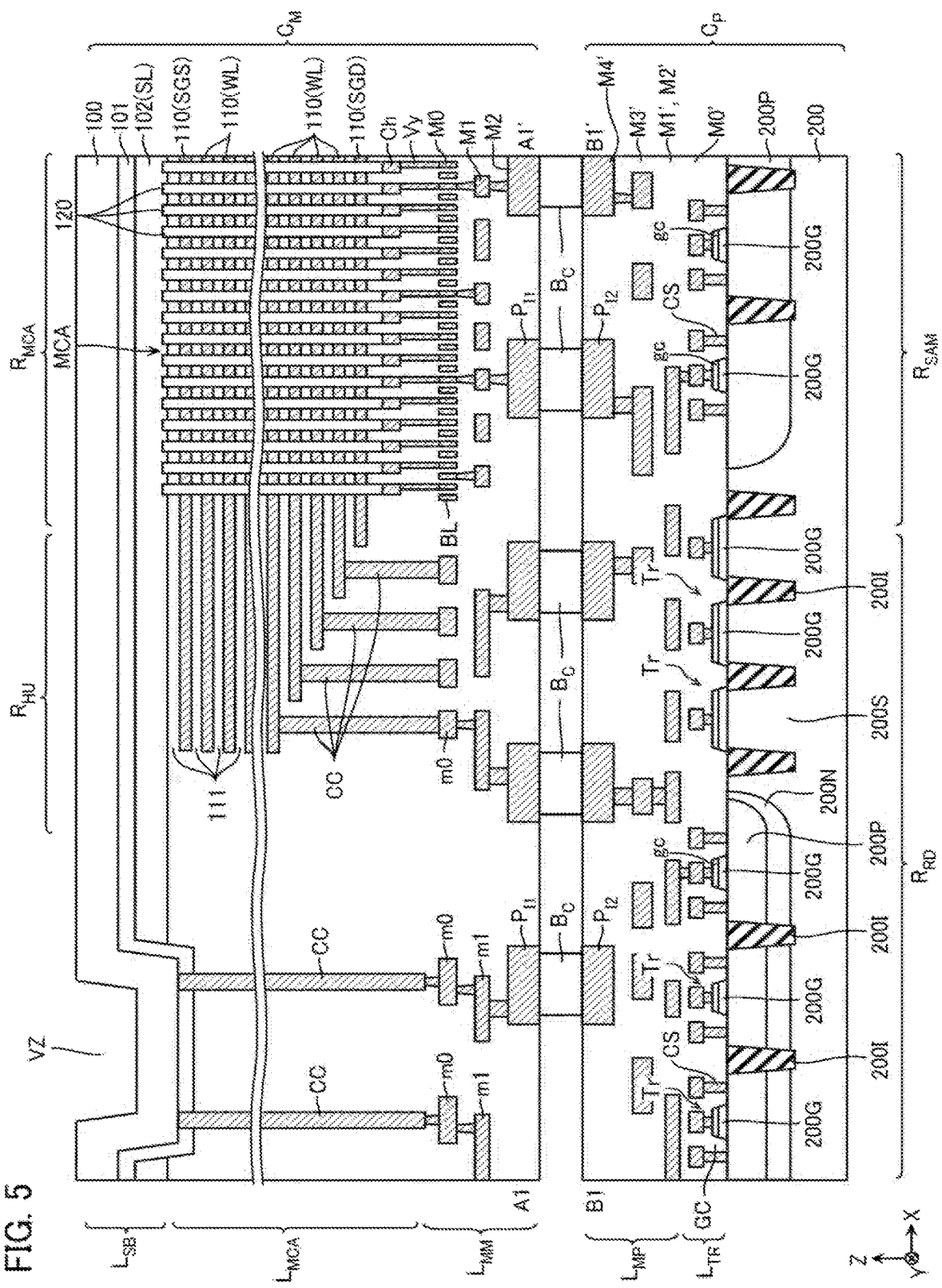
FIG. 5 is a schematic cross-sectional view corresponding to a line A1-A1' of FIG. 3 and a line B1-B1' of FIG. 4.
Figure 6:
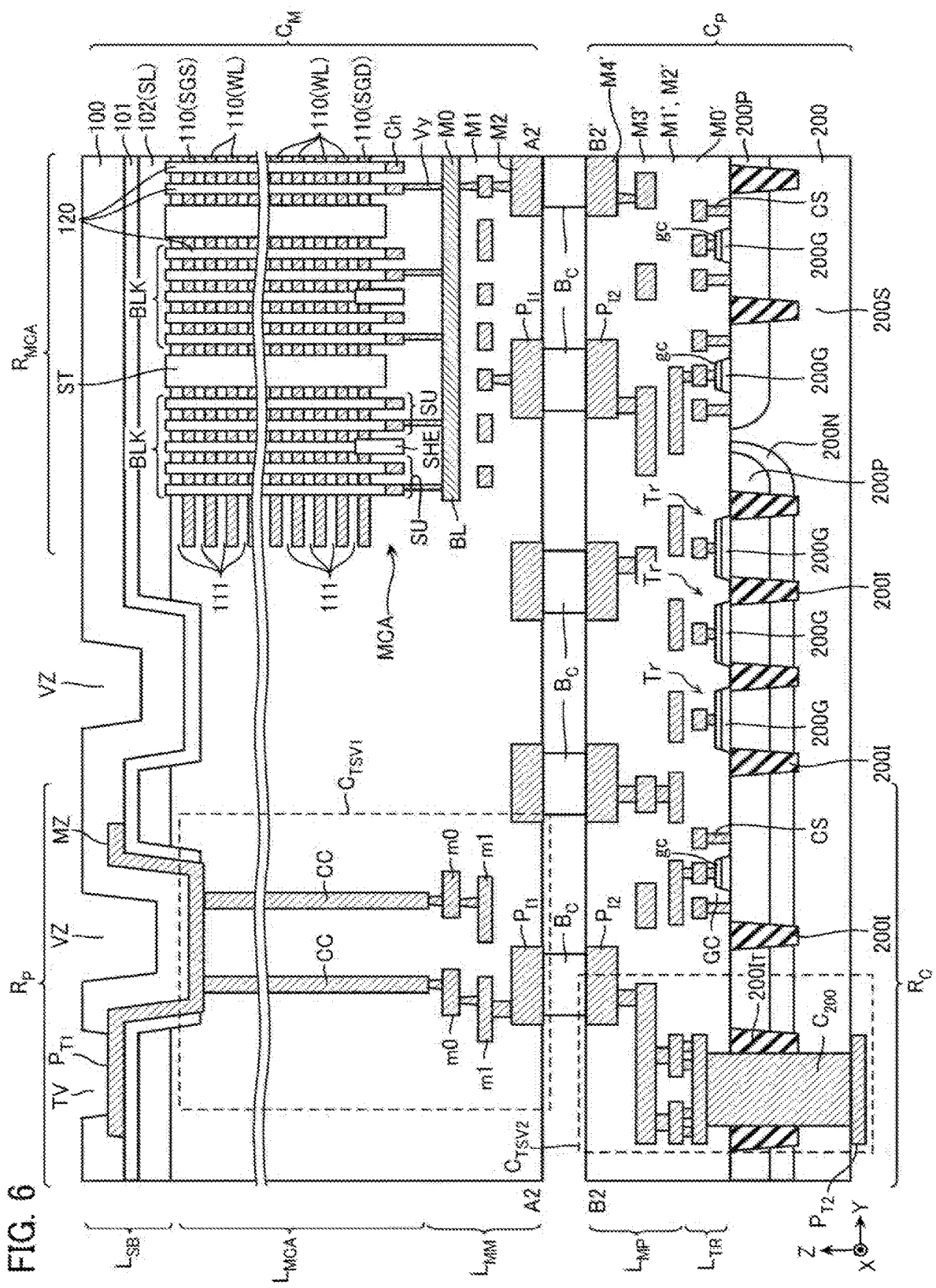
FIG. 6 is a schematic cross-sectional view corresponding to a line A2-A2' of FIG. 3 and a line B2-B2' of FIG. 4.
Figure 7:
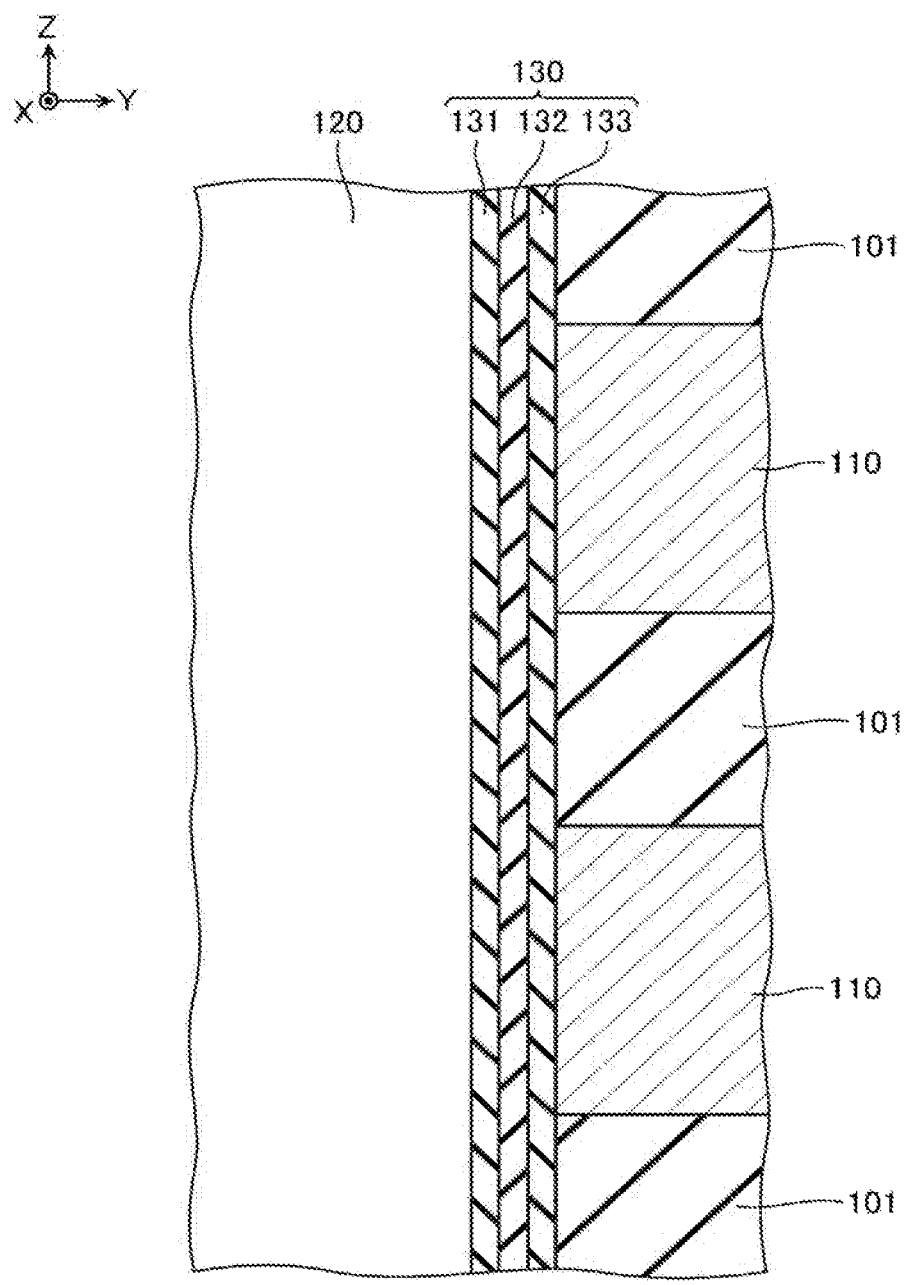
FIG. 7 is a schematic enlarged view of a part of the configuration of FIG. 6.

FIG. 3 is a schematic bottom view illustrating an exemplary configuration of the chip $C_M$. FIG. 4 is a schematic plan view illustrating an exemplary configuration of the chip $C_P$. FIG. 5 is a schematic cross-sectional view corresponding to a line A1-A1' of FIG. 3 and a line B1-B1' of FIG. 4. FIG. 6 is a schematic cross-sectional view corresponding to a line A2-A2' of FIG. 3 and a line B2-B2' of FIG. 4. FIG. 5 and FIG. 6 illustrate cross sections when the structures illustrated in FIG. 3 and FIG. 4 are taken along the respective lines and viewed in arrow directions. FIG. 7 is a schematic enlarged view of a part of the configuration of FIG. 6.

FIG. 2 to FIG. 7 illustrate schematic configurations. The configurations are partially omitted in FIG. 2 to FIG. 7.

[Structure of Chip $C_M$]

For example, as illustrated in FIG. 3, the chip $C_M$ includes four memory planes MP arranged in the X-direction and the Y-direction. The memory plane MP includes a memory cell array region $R_{MCA}$ on which a memory cell array MCA is disposed, and hook-up regions $R_{HU}$ disposed in one end side and the other end side in the X-direction of the memory cell array region $R_{MCA}$. The chip $C_M$ includes a peripheral region $R_P$ disposed in one end side in the Y-direction with respect to the four memory planes MP.

In the illustrated example, the hook-up regions $R_{HU}$ are disposed in both end portions in the X-direction of the memory cell array region $R_{MCA}$. However, this configuration is merely an example, and the specific configuration can be appropriately adjusted. For example, the hook-up regions $R_{HU}$ may be disposed not in both end portions in the X-direction, but in one end portion in the X-direction of the memory cell array region $R_{MCA}$. The hook-up region $R_{HU}$ may be disposed at a center position or a position near the center in the X-direction of the memory cell array region $R_{MCA}$.

For example, as illustrated in FIG. 5 and FIG. 6, the chip $C_M$ includes a substrate layer $L_{SB}$, a memory cell array layer $L_{MCA}$ disposed below the substrate layer $L_{SB}$, and a wiring layer $L_{MM}$ disposed below the memory cell array layer $L_{MCA}$.

[Structure of Substrate Layer $L_{SB}$ of Chip $C_M$]

For example, as illustrated in FIG. 5, the substrate layer $L_{SB}$ includes an insulating layer 100 as an uppermost layer, an insulating layer 101 disposed below the insulating layer 100, and a conductive layer 102 disposed below the insulating layer 101. The insulating layer 100 is, for example, a passivation layer containing an insulating material, such as polyimide. The insulating layer 101 contains, for example, silicon oxide ($SiO_2$) or the like. For example, the conductive layer 102 may include a semiconductor layer of silicon (Si) or the like to which N-type impurities such as phosphorus (P) or P-type impurities such as boron (B) are implanted, may contain a metal such as tungsten (W), or may contain silicide such as tungsten silicide (WSi).

The conductive layer 102 is disposed in the memory cell array region $R_{MCA}$ and the hook-up region $R_{HU}$. Four conductive layers 102 are disposed corresponding to the four memory planes MP (FIG. 3) arranged in the X-direction and the Y-direction. At end portions in the X-direction and the Y-direction of the memory plane MP, regions VZ without the conductive layer 102 are disposed.

For example, as illustrated in FIG. 6, a back side wiring MZ that functions as the first external electrode $P_{T1}$ is disposed in the peripheral region $R_P$. The back side wiring MZ contains, for example, a conductive material such as aluminum (Al). The back side wiring MZ is electrically insulated from the conductive layer 102 via the insulating layer 101. The back side wiring MZ is connected to contacts CC in the memory cell array layer $L_{MCA}$ in the region VZ without the conductive layer 102. A part of the back side wiring MZ is exposed to the outside of the memory device MD from an opening TV provided to the insulating layer 100, and functions as the first external electrode $P_{T1}$.

[Structure of Memory Cell Array Layer $L_{MCA}$ of Chip $C_M$ in Memory Cell Array Region $R_{MCA}$]

For example, as illustrated in FIG. 6, a plurality of memory blocks BLK arranged in the Y-direction are disposed in the memory cell array layer $L_{MCA}$. The memory block BLK includes a plurality of string units SU arranged in the Y-direction. An inter-block insulating layer ST of silicon oxide ($SiO_2$) or the like is disposed between two memory blocks BLK adjacent in the Y-direction. An inter-string unit insulating layer SHE of silicon oxide ($SiO_2$) or the like is disposed between two string units SU adjacent in the Y-direction.

The memory block BLK includes a plurality of conductive layers 110 arranged in the Z-direction, a plurality of semiconductor layers 120 extending in the Z-direction, and a plurality of gate insulating films 130 disposed between the plurality of conductive layers 110 and the respective plurality of semiconductor layers 120.

The conductive layer 110 has an approximately plate shape extending in the X-direction. The conductive layer 110 may include, for example, a stacked film of a barrier conductive film of titanium nitride (TiN) or the like and a metal film of tungsten (W) or the like. The conductive layer 110 may contain polycrystalline silicon or the like containing impurities such as phosphorus (P) or boron (B). Between the plurality of conductive layers 110 arranged in the Z-direction, insulating layers 111 of silicon oxide ($SiO_2$) or the like are disposed.

The conductive layer 102 functions as a source line SL of a NAND flash memory. The source line SL is, for example, disposed in common to all of the memory blocks BLK included in the memory cell array region $R_{MCA}$ (FIG. 3).

Among the plurality of conductive layers 110, one or a plurality of conductive layers 110 positioned at uppermost layers function as a select gate line SGS of the NAND flash memory and gate electrodes of a plurality of select transistors connected to the select gate line SGS. These plurality of conductive layers 110 are electrically independent for each memory block BLK.

A plurality of conductive layers 110 positioned below them function as word lines WL of the NAND flash memory and gate electrodes of a plurality of memory cells connected to the word lines WL. These plurality of conductive layers 110 are electrically independent for each memory block BLK.

One or a plurality of conductive layers 110 positioned below them function as a select gate line SGD of the NAND flash memory and gate electrodes of a plurality of select transistors connected to the select gate line SGD. These plurality of conductive layers 110 are reduced in width in the Y-direction compared with the other conductive layers 110. An inter-string unit insulating layer SHE is disposed between two conductive layers 110 adjacent in the Y-direction. These plurality of conductive layers 110 are electrically independent for each string unit SU.

The semiconductor layers 120 are arranged in the X-direction and the Y-direction in a predetermined pattern. The semiconductor layers 120 function as channel regions of a plurality of memory cells and the select transistors. The semiconductor layer 120 contains polycrystalline silicon (Si) or the like. The semiconductor layer 120 has, for example, an approximately columnar shape or an approximately cylindrical shape. Outer peripheral surfaces of the semiconductor layers 120 are each surrounded by the conductive layers 110, and opposed to the conductive layers 110.

In the lower end portion of the semiconductor layer 120, an impurity region containing N-type impurities, such as phosphorus (P) is disposed. This impurity region is connected to a bit line BL via a contact Ch and a contact Vy. These plurality of bit lines BL are connected to the configuration in the chip $C_P$ via a wiring m1 in a wiring layer M1 and the first internal electrode $P_{f1}$ in a wiring layer M2. The plurality of first internal electrodes $P_{f1}$ in the memory cell array region $R_{MCA}$ illustrated in FIG. 3 are electrically connected to the first external electrode $P_{T1}$ as illustrated in FIG. 5 and FIG. 6.

In the upper end portion of the semiconductor layer 120, an impurity region containing N-type impurities, such as phosphorus (P) or P-type impurities, such as boron (B) is disposed. This impurity region is connected to the above-described conductive layer 102.

The gate insulating film 130 has an approximately cylindrical shape that covers the outer peripheral surface of the semiconductor layer 120. For example, as illustrated in FIG. 7, the gate insulating film 130 includes a tunnel insulating film 131, an electric charge accumulating film 132, and a block insulating film 133 stacked between the semiconductor layer 120 and the conductive layers 110. The tunnel insulating film 131 and the block insulating film 133 contain silicon oxide ($SiO_2$) or the like. The electric charge accumulating film 132 includes a film of silicon nitride ($Si_3N_4$) or the like that can accumulate an electric charge. The tunnel insulating film 131, the electric charge accumulating film 132, and the block insulating film 133 have approximately cylindrical shapes, and extend in the Z-direction along the outer peripheral surface of the semiconductor layer 120 excluding a contact portion between the semiconductor layer 120 and the conductive layer 102.

FIG. 7 illustrates an example in which the gate insulating film 130 includes the electric charge accumulating film 132 of silicon nitride or the like. However, the gate insulating film 130 may include a floating gate of polycrystalline silicon or the like containing N-type or P-type impurities.

[Structure of Memory Cell Array Layer $L_{MCA}$ of Chip $C_M$ in Hook-Up Region $R_{HU}$]

As illustrated in FIG. 5, the hook-up region $R_{HU}$ includes end portions in the X-direction of a plurality of conductive layers 110 that each function as the word line WL, the select gate line SGS, or the select gate line SGD. The hook-up region $R_{HU}$ includes a plurality of contacts CC. These plurality of contacts CC extend in the Z-direction, and are connected to the conductive layer 110 at upper ends. The contact CC may include, for example, a stacked film of a barrier conductive film of titanium nitride (TiN) or the like and a metal film of tungsten (W) or the like. As illustrated in FIG. 5, these plurality of contacts CC are connected to the configuration in the chip $C_P$ via the wirings m0, m1 in the wiring layers M0, M1 and the first internal electrodes $P_{f1}$ in the wiring layer M2. The plurality of first internal electrodes $P_{f1}$ in the hook-up region $R_{HU}$ illustrated in FIG. 3 are electrically connected to the conductive layers 110 as illustrated in FIG. 5.

[Structure of Memory Cell Array Layer $L_{MCA}$ of Chip $C_M$ in Peripheral Region $R_P$]

For example, as illustrated in FIG. 6, the peripheral region $R_P$ includes a plurality of contacts CC corresponding to the first external electrodes $P_{T1}$. These plurality of contacts CC are connected to the back side wiring MZ at upper ends. These plurality of contacts CC are connected to the configuration in the chip $C_P$ via the wirings m0, m1 in the wiring layers M0, M1 and the first internal electrodes $P_{f1}$ in the wiring layer M2. The plurality of first internal electrodes $P_{f1}$ in the peripheral region $R_P$ illustrated in FIG. 3 are electrically connected to the first external electrodes $P_{T1}$ as illustrated in FIG. 6.

[Structure of Wiring Layer $L_{MM}$ of Chip $C_M$]

For example, as illustrated in FIG. 5 and FIG. 6, the wiring layer $L_{MM}$ includes a plurality of wiring layers M0, M1, and M2. A plurality of wirings and electrodes included in the wiring layers M0, M1, and M2 are electrically connected to, for example, at least one of the configuration in the memory cell array layer $L_{MCA}$ or the configuration in the chip $C_P$.

The wiring layer M0 includes a plurality of wirings m0. These plurality of wirings m0 may each include, for example, a stacked film of a barrier conductive film of titanium nitride (TiN) or the like and a metal film of copper (Cu) or the like. A part of the plurality of wirings m0 function as bit lines BL (FIG. 5). The bit lines BL are arranged in the X-direction, and extend in the Y-direction. These plurality of bit lines BL are each connected to one of the semiconductor layers 120 included in each of the string units SU.

For example, as illustrated in FIG. 5 and FIG. 6, the wiring layer M1 includes a plurality of wirings m1. These plurality of wirings m1 may each include, for example, a stacked film of a barrier conductive film of titanium nitride (TiN) or the like and a metal film of tungsten (W) or the like.

The wiring layer M2 includes a plurality of first internal electrodes $P_{I1}$. These plurality of first internal electrodes $P_{I1}$ may each include, for example, a stacked film of a barrier conductive film of titanium nitride (TiN) or the like and a metal film of copper (Cu) or the like.

The contact CC and the wirings m0, m1 in the wiring layers M0, M1 disposed to a current path between the first external electrode $P_{T1}$ and the first internal electrode $P_{I1}$ correspond to the first electrode $C_{TSV1}$ schematically illustrated in FIG. 1.

[Structure of Chip $C_P$]

For example, as illustrated in FIG. 4, the chip $C_P$ includes four peripheral circuit regions $R_{PC}$ arranged in the X-direction and Y-direction corresponding to the memory planes MP. The peripheral circuit region $R_{PC}$ includes a sense amplifier module region $R_{SAM}$ disposed in a part of a region opposed to the memory cell array region $R_{MCA}$, and row decoder regions $R_{RD}$ disposed in regions opposed to the hook-up regions $R_{HU}$. The chip $C_P$ includes a circuit region $R_C$ disposed in a region opposed to the peripheral region $R_P$.

For example, as illustrated in FIG. 5 and FIG. 6, the chip $C_P$ includes a semiconductor substrate 200, a transistor layer $L_{TR}$ disposed above the semiconductor substrate 200, and a wiring layer $L_{MP}$ disposed above the transistor layer $L_{TR}$. The wiring layer $L_{MP}$ includes a plurality of wiring layers M0', M1', M2', M3', and M4'.

[Structure of Semiconductor Substrate 200 in Chip $C_P$]

The semiconductor substrate 200 contains, for example, P-type silicon (Si) containing P-type impurities, such as boron (B). For example, as illustrated in FIG. 5, on the surface of the semiconductor substrate 200, an N-type well region 200N containing N-type impurities, such as phosphorus (P), a P-type well region 200P containing P-type impurities, such as boron (B), a semiconductor substrate region 200S in which the N-type well region 200N or the P-type well region 200P is not disposed, and an insulating region 200I. Each of the N-type well region 200N, the P-type well region 200P, and the semiconductor substrate region 200S functions as a part of a plurality of transistors Tr, a plurality of capacitors, and the like constituting the peripheral circuit PC.

[Structure of Transistor Layer $L_{TR}$ in Chip $C_P$]

For example, as illustrated in FIG. 5, a wiring layer GC is disposed on an upper surface of the semiconductor substrate 200 via an insulating layer 200G. The wiring layer GC includes a plurality of electrodes gc opposed to the surface of the semiconductor substrate 200. The regions of the semiconductor substrate 200 and the plurality of electrodes gc included in the wiring layer GC are each connected to a contact CS.

The respective plurality of electrodes gc included in the wiring layer GC function as gate electrodes of the plurality of transistors Tr, respective one electrodes of the plurality of capacitors, and the like constituting the peripheral circuit PC.

The contact CS may include, for example, a stacked film of a barrier conductive film of titanium nitride (TiN) or the like and a metal film of tungsten (W) or the like. An impurity region containing N-type impurities or P-type impurities is disposed at a connecting portion between the contact CS and the semiconductor substrate 200.

[Structure of Wiring Layer $L_{MP}$ in Chip $C_P$]

As described above, the wiring layer $L_{MP}$ of the chip $C_P$ includes the wiring layers M0', M1', M2', M3', and M4'. The wiring layer M0' is disposed above the transistor layer $L_{TR}$. The wiring layer M0' contains a conductive material, such as tungsten (W). The wiring layer M1' is disposed above the wiring layer M0'. The wiring layer M1' contains a conductive material, such as tungsten (W). The wiring layer M2', which is omitted in FIG. 5 and FIG. 6, is disposed above the wiring layer M1'. The wiring layer M2' contains a conductive material, such as copper (Cu). The wiring layer M3' contains a conductive material, such as copper (Cu) or aluminum (Al). The wiring layer M4' is, for example, a wiring layer containing a conductive material, such as copper (Cu), and includes a plurality of second internal electrodes $P_{I2}$.

[Structure of Substrate-Through Electrode $C_{200}$ in Chip $C_P$]

For example, as illustrated in FIG. 6, a substrate-through electrode $C_{200}$ penetrating the semiconductor substrate 200 is disposed in the circuit region $R_C$. The substrate-through electrode $C_{200}$ may include, for example, a stacked film of a barrier conductive film of titanium nitride (TiN) or the like, a seed layer of tungsten (W) or the like, and a metal film of nickel (Ni) or the like. An insulating region $200I_T$ is disposed on an upper surface of the semiconductor substrate 200. The second external electrode $P_{T2}$ is disposed on the lower surface of the semiconductor substrate 200. The substrate-through electrode $C_{200}$ is connected to the second external electrode $P_{T2}$ at the lower end, and connected to a wiring in a wiring layer at the upper end.

The substrate-through electrode $C_{200}$ and the wirings in the wiring layers M0', M1', M2', and M3' disposed to the current path between the second external electrode $P_{T2}$ and the second internal electrode $P_{I2}$ correspond to the second electrode $C_{TSV2}$ schematically illustrated in FIG. 1.

[Connection Between Chips $C_P$ and $C_M$ by Bump Electrode $B_C$]

For example, as illustrated in FIG. 5 and FIG. 6, the plurality of first internal electrodes $P_{I1}$ of the chip $C_M$ are connected to the respective plurality of second internal electrodes $P_{I2}$ of chip $C_P$ via the plurality of bump electrodes $B_C$.

Each of the plurality of bump electrodes $B_C$ contains a conductive material, such as copper (Cu).

The bit line BL is electrically conducted with the sense amplifier of the peripheral circuit PC via a path of the wirings m0, m1 of the wiring layers M0, M1, the first internal electrode $P_{I1}$ of the wiring layer M2, the bump electrode $B_C$, the second internal electrode $P_{I2}$ of the wiring layer M4', the wirings of the wiring layers M3', M2', M1', and M0', and the contact CS.

The word line WL (conductive layer 110) is electrically conducted with the row decoder of the peripheral circuit PC via a path of the contact CC, the wirings m0, m1 of the wiring layers M0, M1, the first internal electrode $P_{I1}$ of the wiring layer M2, the bump electrode $B_C$, the second internal electrode $P_{I2}$ of the wiring layer M4', the wirings of the wiring layers M3', M2', M1', and M0', and the contact CS.

The first external electrode $P_{T1}$ and the second external electrode $P_{T2}$ are electrically conducted with an input/output circuit (not illustrated) via a path of the contact CC, the wirings m0, m1 of the wiring layers M0, M1, the first internal electrode $P_{I1}$ of the wiring layer M2, the bump electrode $B_C$, the second internal electrode $P_{I2}$ of the wiring layer M4', the wirings of the wiring layers M3', M2', M1', and M0', and the contact CS.

[Connection Between Memory Devices MD by Bump Electrode $B_{MD}$]

Figure 8:
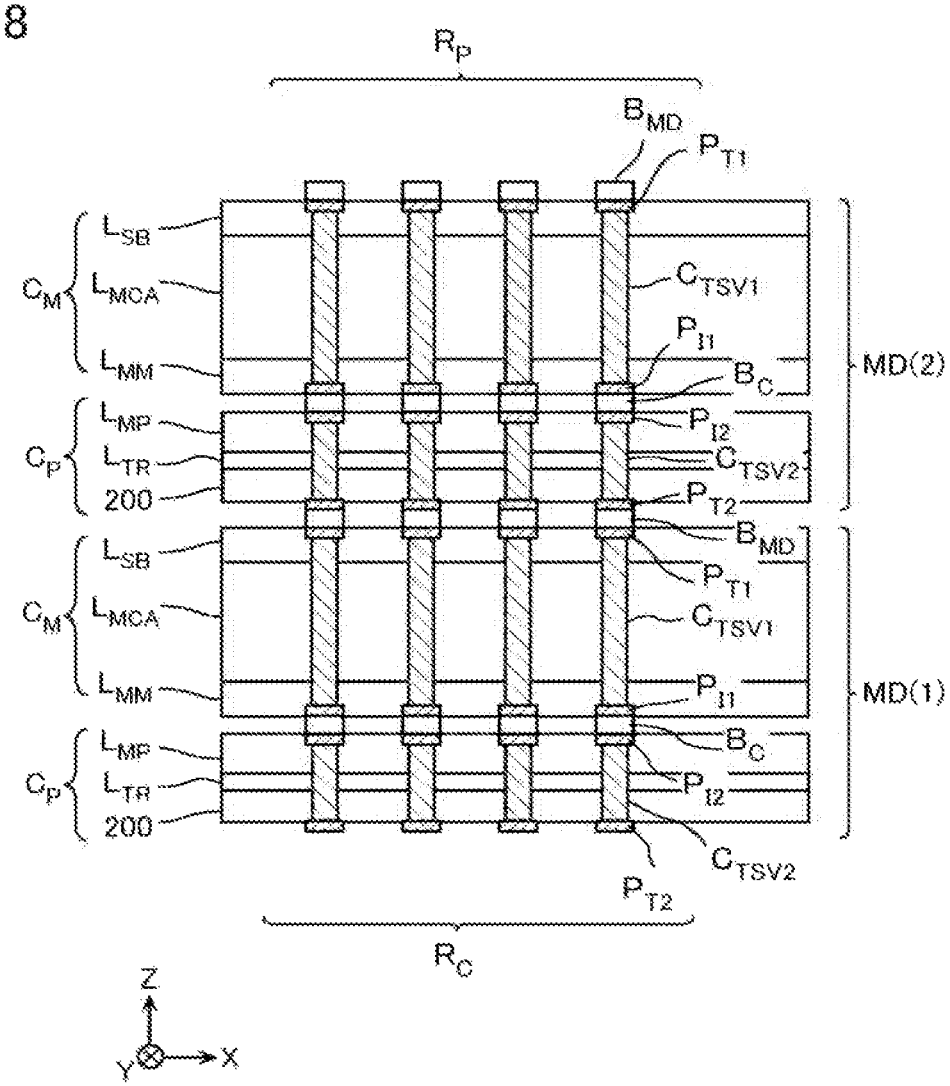
FIG. 8 is a schematic cross-sectional view for describing a connection between the memory devices MD by bump electrodes $B_{MD}$.

FIG. 8 is a schematic cross-sectional view for describing the connection between the memory devices MD by the bump electrodes $B_{MD}$. The first internal electrode $P_{I1}$ and the second internal electrode $P_{I2}$ have sizes (areas in XY plane) smaller than sizes (areas in XY plane) of the first external electrode $P_{T1}$ and the second external electrode $P_{T2}$. The bump electrode $B_C$ has a size (width in Z-direction, and area in XY plane) smaller than a size (width in Z-direction, and area in XY plane) of the bump electrode $B_{MD}$. However, in FIG. 8, the first internal electrode $P_{I1}$ and the second internal electrode $P_{I2}$ are illustrated in the sizes the same as those of the first external electrode $P_{T1}$ and the second external electrode $P_{T2}$. The bump electrode $B_C$ and the bump electrode $B_{MD}$ are illustrated in the same size.

For example, as illustrated in FIG. 8, the plurality of first external electrodes $P_{T1}$ of the chip $C_M$ of one memory device (for example, MD(1)) are connected to the respective plurality of second external electrodes $P_{T2}$ of the chip $C_P$ of another memory device (for example, MD(2)) via the plurality of bump electrodes $B_{MD}$.

Each of the plurality of bump electrodes $B_{MD}$ may be formed of a conductive material containing tin (Sn) or the like, and may include a plurality of stacked metal layers.

The peripheral circuits PC of the plurality of chips $C_P$ are electrically conducted with the controller die CD (FIG. 1) via the paths in the memory devices MD (first external electrode $P_{T1}$, first electrode $C_{TSV1}$, first internal electrode $P_{I1}$, bump electrode $B_C$, second internal electrode $P_{I2}$, second electrode $C_{TSV2}$, and second external electrode $P_{T2}$), the bump electrodes $B_{MD}$ between the memory devices MD, and the wirings 10 in the package substrate PS. For example, a data signal, an external control signal, and the like are input and output between the controller die CD (FIG. 1) and the peripheral circuit PC of the chip $C_P$. The plurality of electrodes disposed on the upper surface of the package substrate PS are electrically connected to the respective plurality of second external electrodes $P_{T2}$ disposed on the lower surface of the memory device MD(1).

[Method of Manufacturing Semiconductor Package PG1]

Next, a method of manufacturing the semiconductor package PG1 will be described with reference to FIG. 9 to FIG. 14.

Figure 9:
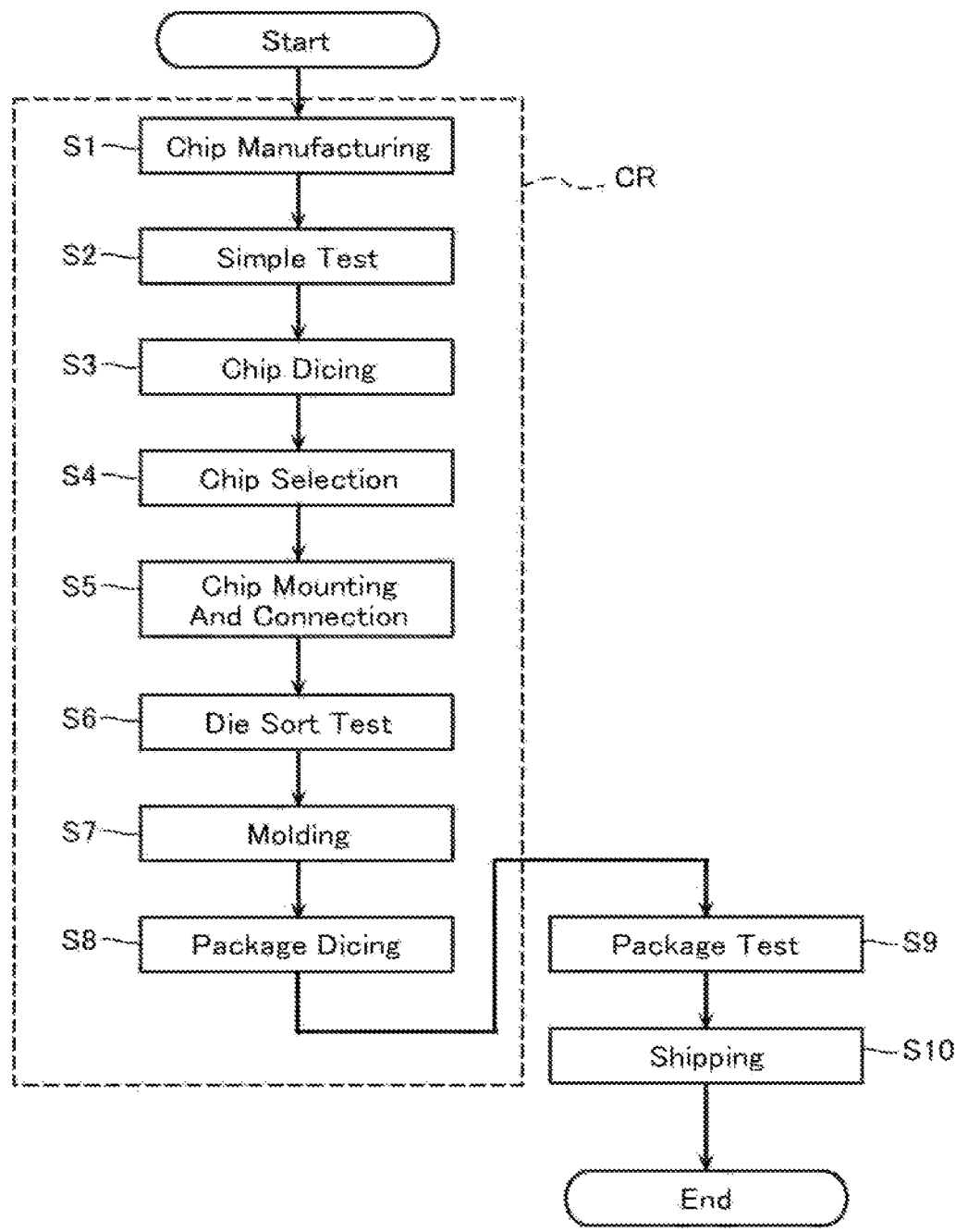
FIG. 9 is a flowchart for describing a method of manufacturing the semiconductor package PG1 according to the first embodiment.
Figure 10:
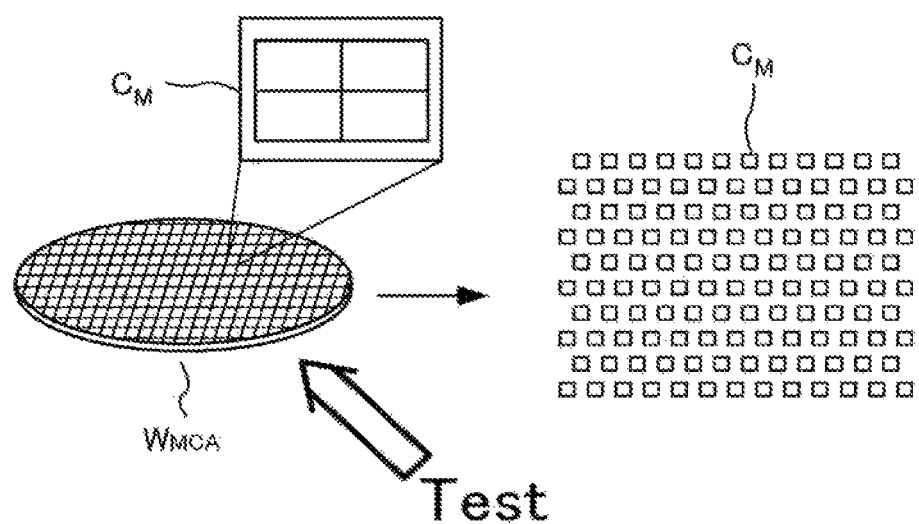
FIG. 10 is a schematic diagram for describing a process of manufacturing a chip, a test, and dicing.
Figure 10:
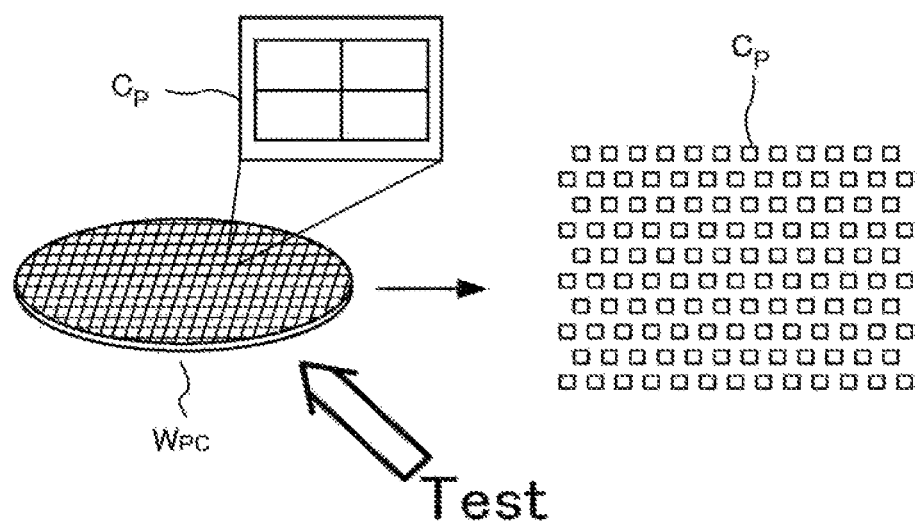

FIG. 9 is a flowchart for describing the method of manufacturing the semiconductor package PG1. FIG. 10 is a schematic diagram for describing a process of manufacturing a chip, a test, and dicing. FIG. 11 to FIG. 14 are schematic cross-sectional views for describing the method of manufacturing the semiconductor package PG1. "CR" in FIG. 9 means a clean room.

First, the chips $C_M$, $C_P$ are manufactured (Step S1). For example, in the clean room CR, semiconductor manufacturing equipment performs manufacturing processes of film formation, masking, exposure, developing, etching, impurity diffusion, and the like on a wafer $W_{MCA}$, in the memory cell array MCA side. Accordingly, as illustrated in FIG. 10, a plurality of the chips $C_M$ arranged in a grid pattern are formed on the wafer $W_{MCA}$. At this time, a plurality of the first electrodes $C_{TSV1}$ are formed on the chip $C_M$. The surfaces of the chips $C_M$ are ground.

In the clean room CR, the semiconductor manufacturing equipment performs manufacturing processes of film formation, masking, exposure, developing, etching, impurity diffusion, and the like on a wafer $W_{PC}$ in the peripheral circuit PC side. Accordingly, as illustrated in FIG. 10, a plurality of the chips $C_P$ arranged in a grid pattern are formed on the wafer $W_{PC}$ as well. At this time, a plurality of the second electrodes $C_{TSV2}$ are formed on the chip $C_P$. The surfaces of the chips $C_P$ are ground.

Next, a simple test is individually performed on the wafers $W_{MCA}$, $W_{PC}$ (Step S2). As the simple test, for example, a test for checking electrical connection or a test for checking operation of the circuit or the like is performed on the plurality of chips $C_M$, $C_P$ formed on the wafers $W_{MCA}$, $W_{PC}$, respectively using a test device. Through the simple test, whether the plurality of chips $C_M$, $C_P$ are excellent or poor is determined.

Next, dicing of the chips $C_M$, $C_P$ is performed (Step S3). For example, as illustrated in FIG. 10, a plurality of the chips $C_M$ are clipped from the wafer $W_{MCA}$. Similarly, a plurality of the chips $C_P$ are clipped from the wafer $W_{PC}$. In the example of FIG. 9, the dicing of the chips $C_M$, $C_P$ (Step S3) is performed after performing the simple test on the wafers $W_{MCA}$, $W_{PC}$ (Step S2). However, the simple test to the chips $C_M$, $C_P$ may be performed after performing the dicing of the chips $C_M$, $C_P$.

Then, selection of the chips $C_M$, $C_P$ is performed (Step S4). Here, the chips $C_M$, $C_P$ determined to be excellent in property by the simple test are selected.

Figure 11:
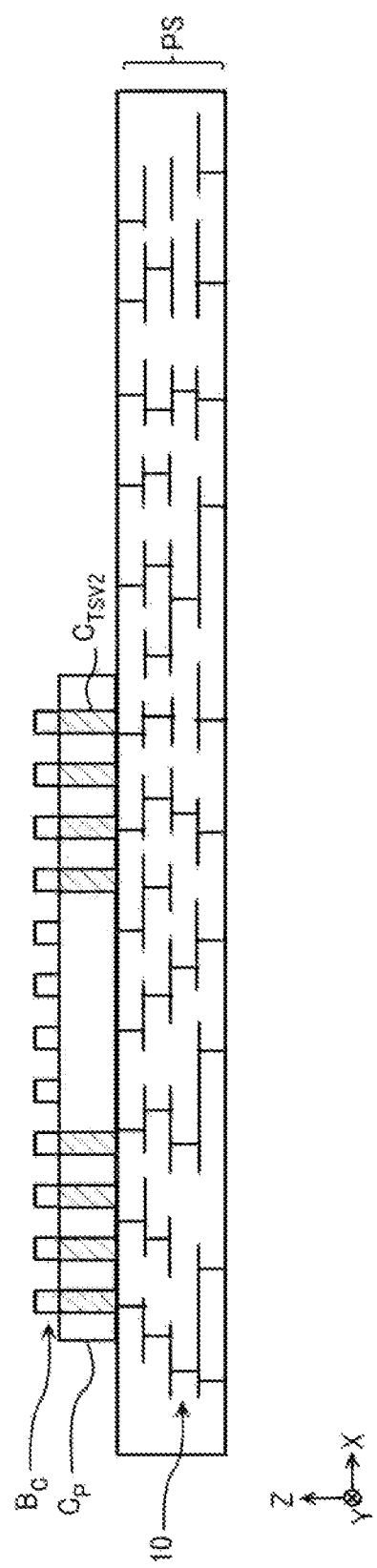
FIG. 11 is a schematic cross-sectional view for describing the method of manufacturing the semiconductor package PG1.

Next, the chips $C_M$, $C_P$ are mounted, and the chips $C_M$, $C_P$ are mutually connected (Step S5). For example, as illustrated in FIG. 11, the chip $C_P$ is mounted to the upper surface of the package substrate PS. At this time, the plurality of second external electrodes $P_{T2}$ of the chip $C_P$ are electrically connected to a respective plurality of electrodes formed on the upper surface of the package substrate PS. Although not illustrated in FIG. 11, a plurality of the chips $C_P$ may be mounted to the upper surface of the package substrate PS.

Figure 12:
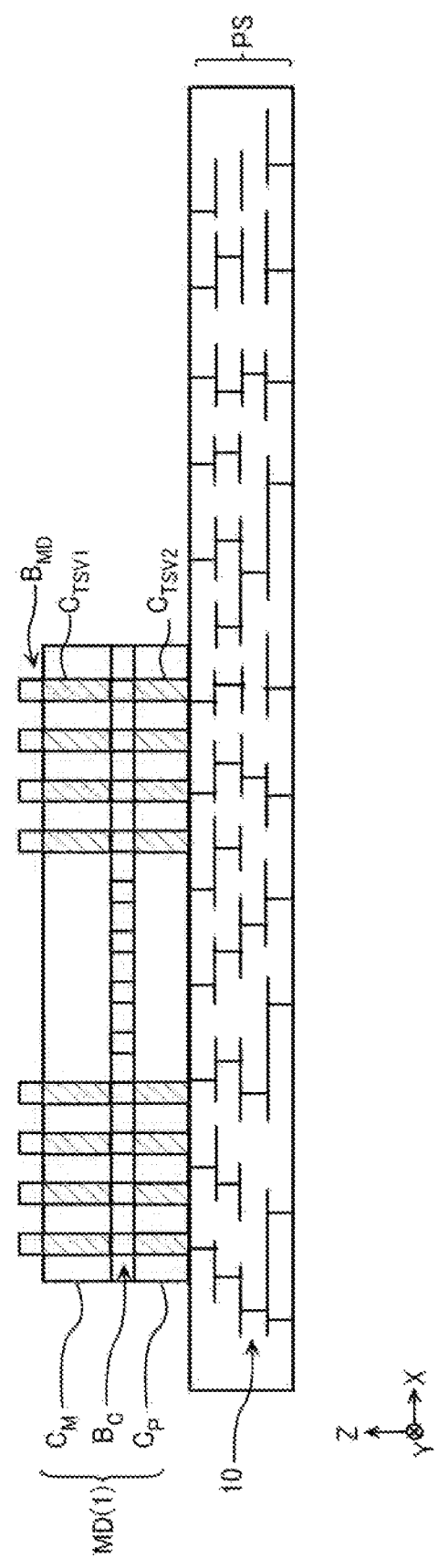
FIG. 12 is a schematic cross-sectional view for describing the manufacturing method.

As illustrated in FIG. 12, the chip $C_M$ is mounted above the chip $C_P$ via the plurality of bump electrodes $B_C$. At this time, the plurality of first internal electrodes $P_{I1}$ of the chip $C_M$ are electrically connected to the respective plurality of bump electrodes $B_C$. Accordingly, the memory device MD(1) is configured.

Figure 13:
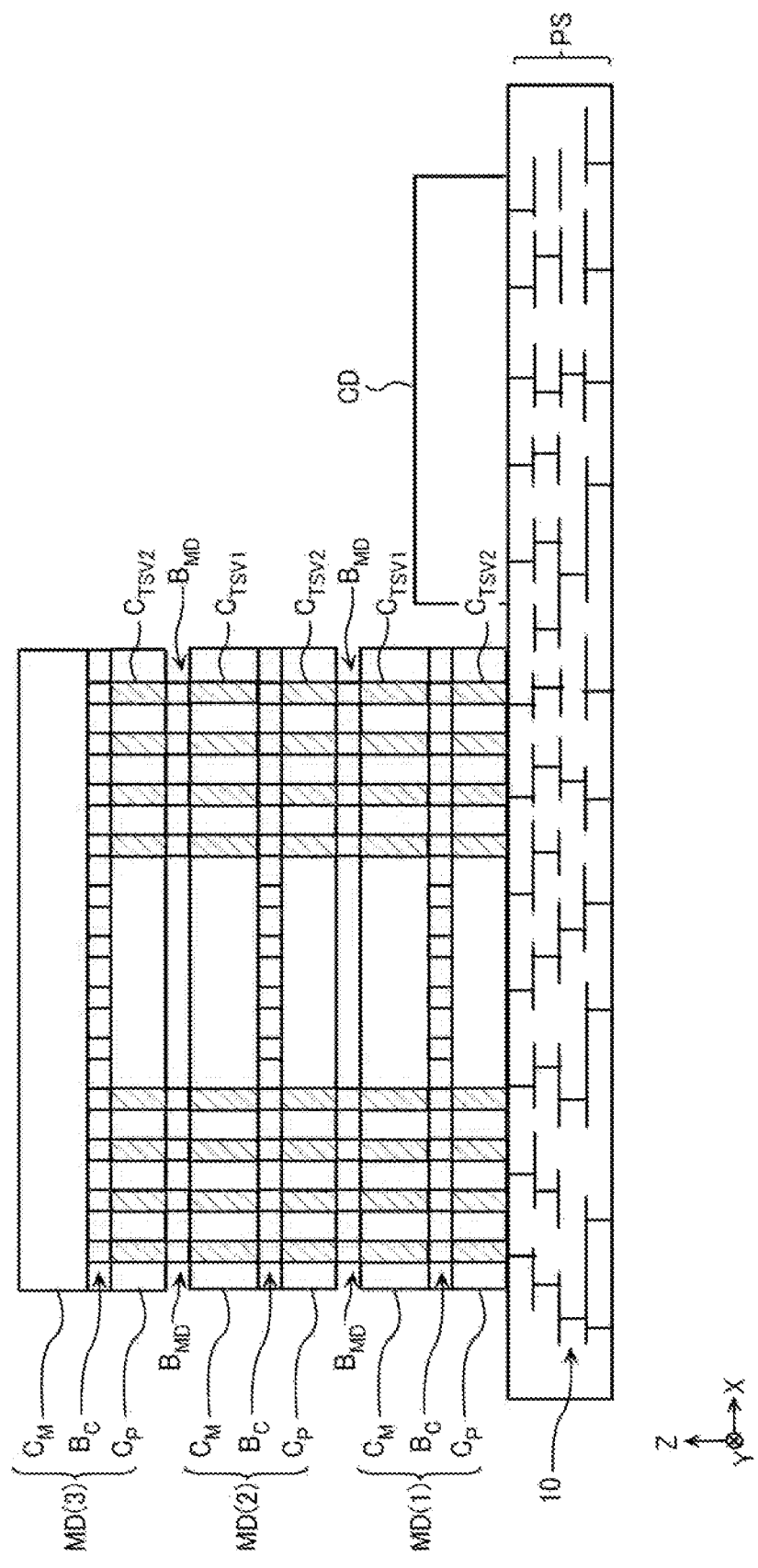
FIG. 13 is a schematic cross-sectional view for describing the manufacturing method.

For example, as illustrated in FIG. 13, the chip $C_P$ is mounted above the chip $C_M$ of the memory device MD(1) via the plurality of bump electrodes $B_{MD}$. At this time, the plurality of second external electrodes $P_{T2}$ of the chip $C_P$ are electrically connected to the respective plurality of bump electrodes $B_{MD}$. In the following, similarly, the chip $C_M$ is mounted above the chip $C_P$ of the memory device MD(2) via the plurality of bump electrodes $B_C$, the chip $C_P$ is mounted above the chip $C_M$ of the memory device MD(2) via the plurality of bump electrodes $B_{MD}$, and the chip $C_M$ is mounted above the chip $C_P$ of the memory device MD(3) via the plurality of bump electrodes $B_C$. For example, as illustrated in FIG. 13, the controller die CD is mounted to the upper surface of the package substrate PS. At this time, a plurality of pad electrodes of the controller die CD are electrically connected to a respective plurality of electrodes formed on the upper surface of the package substrate PS.

Next, a die sort test is performed (Step S6). As the die sort test, for example, a test on electrical property of each element, such as a transistor and a capacitor, necessary for the operation of the circuit is performed, and whether the element functions or not is determined. Whether the chips $C_M$, $C_P$ are each normally connected or not is determined. Through the die sort test, whether the plurality of devices (chips $C_M$, $C_P$) and the like mounted to the package substrate PS are excellent or poor is determined.

Figure 14:
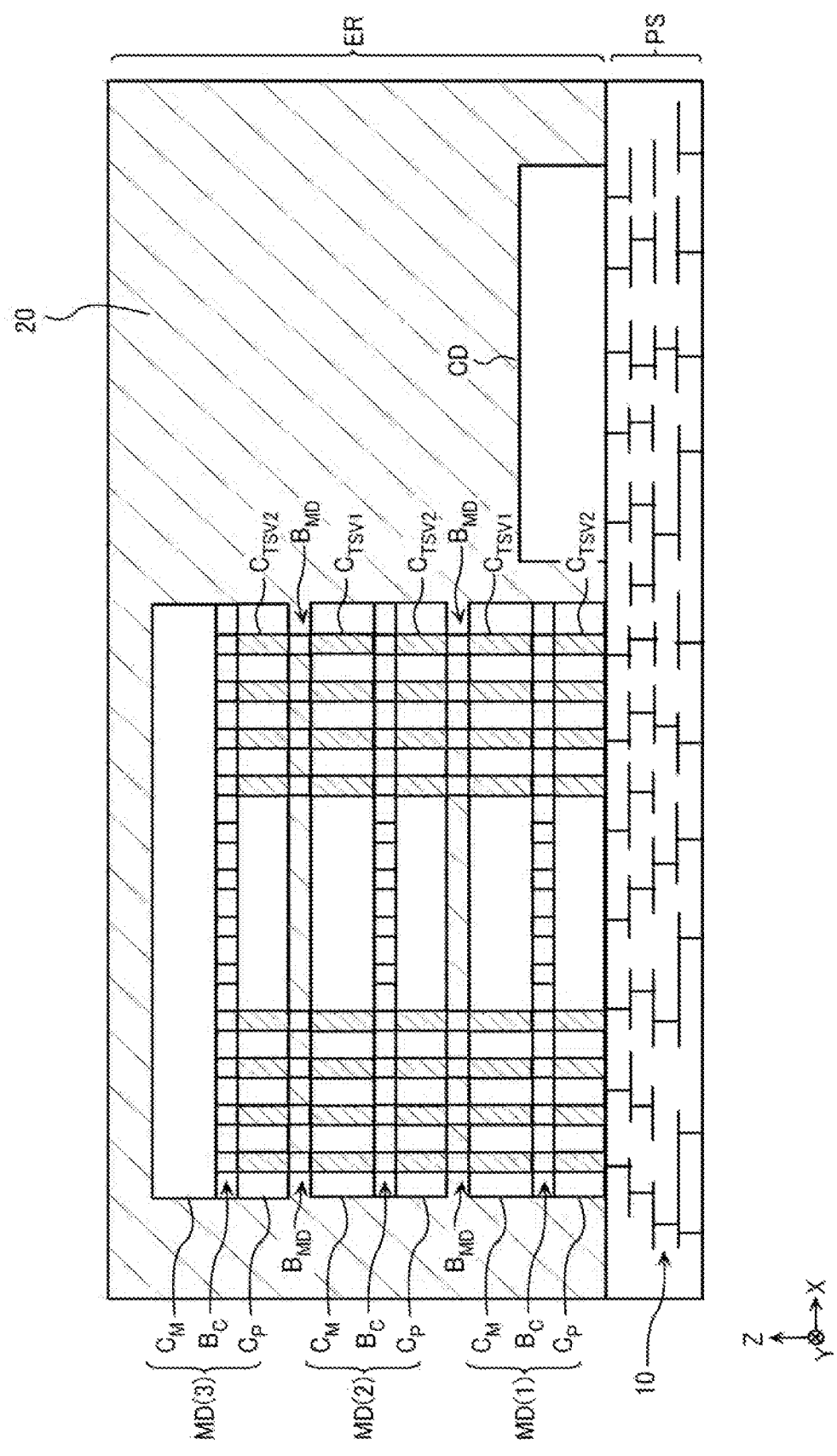
FIG. 14 is a schematic cross-sectional view for describing the manufacturing method.

Next, the plurality of memory devices MD (chips $C_M$, $C_P$) and the controller die CD on the package substrate PS are molded (Step S7). For example, as illustrated in FIG. 14, a region ER on the package substrate PS in which the plurality of memory devices MD (chips $C_M$, $C_P$) and the controller die CD are mounted is molded by a thermosetting sealing resin 20. The sealing resin 20 mainly contains, for example, an epoxy resin. At this time, a region between the two chips $C_M$, $C_P$ (region in which bump electrodes $B_C$ are disposed) and a region between the two memory devices MD (region in which bump electrodes $B_{MD}$ are disposed) are also molded by the sealing resin 20. Subsequently, a plurality of solder balls 30 are attached to the lower surface of the package substrate PS.

Next, dicing of the semiconductor package PG1 is performed (Step S8). In this embodiment, the processes from Steps S1 to S8 are performed in the clean room CR.

A test of the semiconductor package PG1 is performed (Step S9). As the test of the semiconductor package PG1, for example, a test on temperature and voltage, an electrical property test, an appearance structure inspection, and the like are performed.

Then, the semiconductor package PG1 is shipped (Step S10).

Comparative Example

Next, with reference to FIG. 15 to FIG. 17, a method of manufacturing a semiconductor memory device according to a comparative example will be described.

Figure 15:
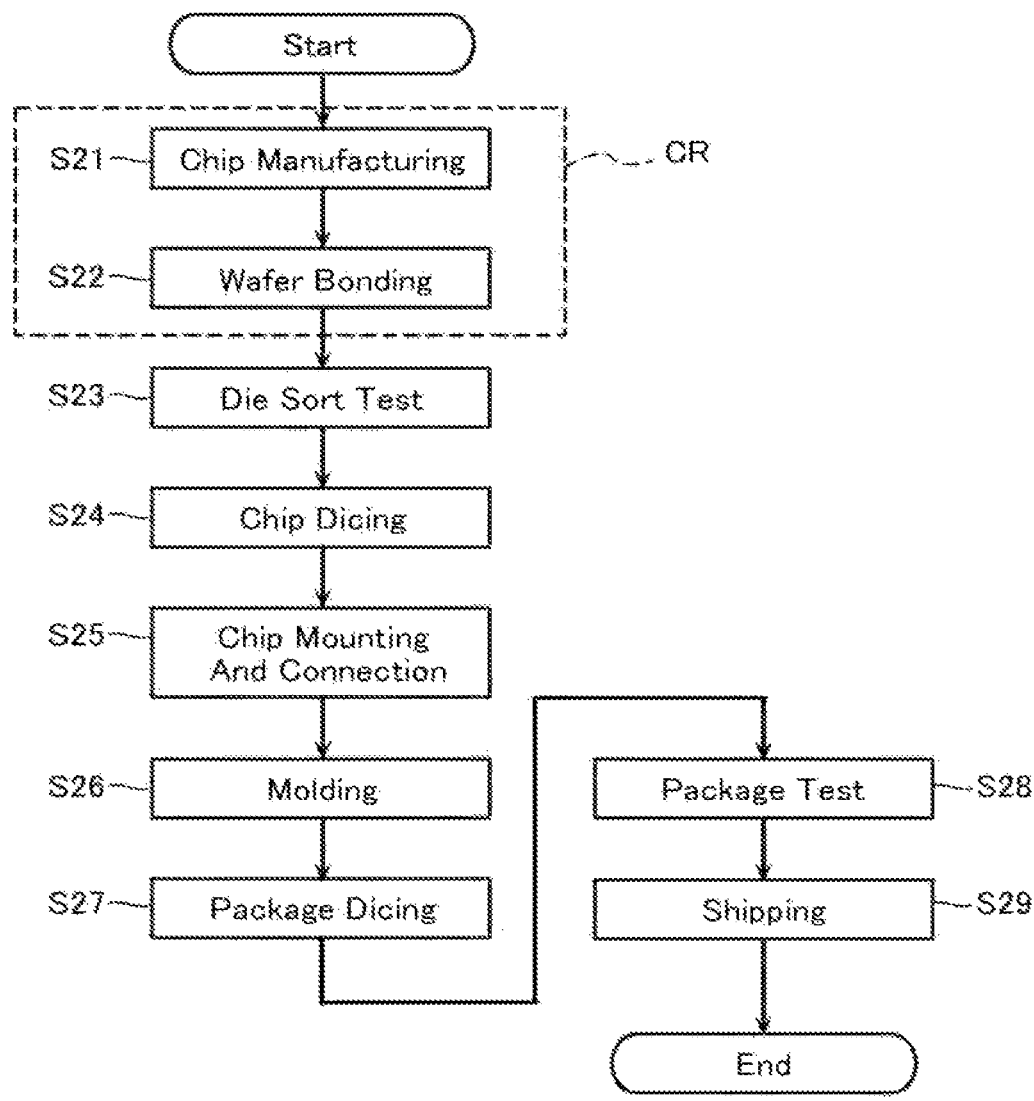
FIG. 15 is a flowchart for describing a method of manufacturing a semiconductor memory device according to a comparative example.

FIG. 15 is a flowchart for describing the method of manufacturing a semiconductor memory device according to the comparative example. FIG. 16 is a schematic diagram for describing a part of processes in the method of manufacturing a semiconductor memory device according to the comparative example. FIG. 17 is a schematic cross-sectional view illustrating an exemplary configuration of a memory device according to the comparative example. "CR" in FIG. 15 means a clean room.

First, the chips $C_{ME}$, $C_{PE}$ are manufactured (Step S21). In the clean room CR, semiconductor manufacturing equipment performs a plurality of kinds of manufacturing processes on a wafer $W_{MCAE}$ in the memory cell array MCA side. A plurality of the chips $C_{ME}$ arranged in a grid pattern are formed on the wafer $W_{MCAE}$. In the clean room CR, the semiconductor manufacturing equipment performs a plurality of kinds of manufacturing processes on a wafer $W_{PCE}$ in the peripheral circuit PC side. A plurality of the chips $C_{PE}$ arranged in a grid pattern are formed on the wafer $W_{PCE}$ as well.

Figure 16:
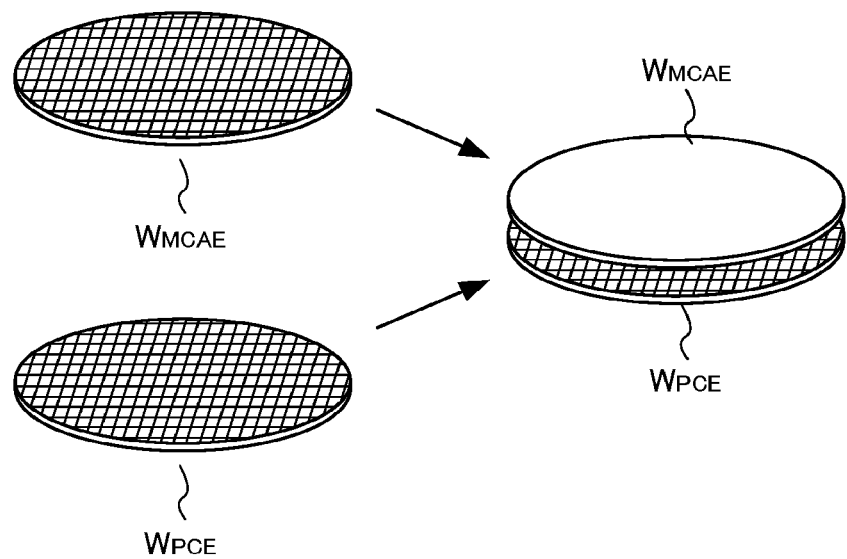
FIG. 16 is a schematic diagram for describing a part of processes in the manufacturing method.
Figure 17:
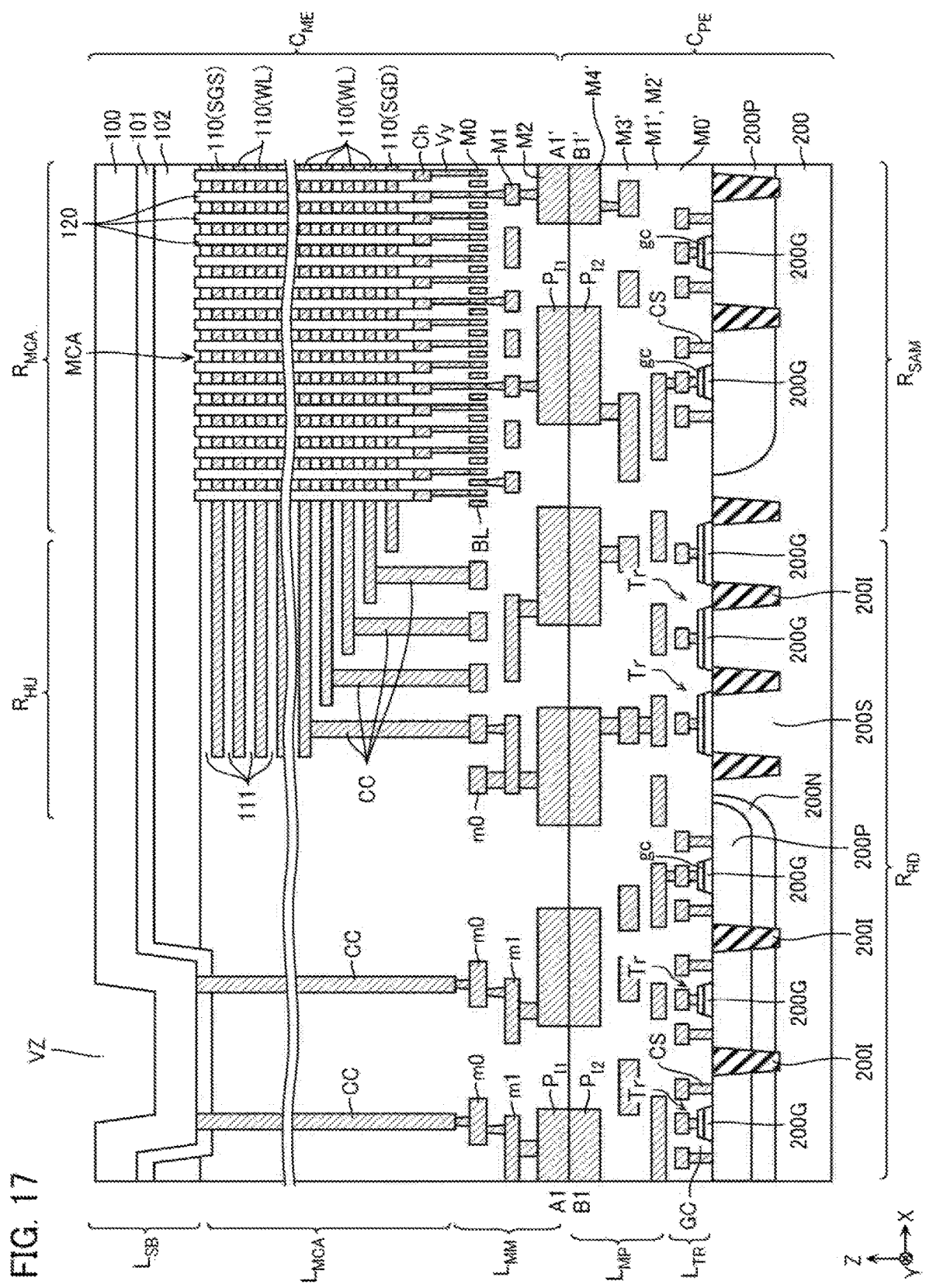
FIG. 17 is a schematic cross-sectional view illustrating an exemplary configuration of a memory device according to the comparative example.

Next, for example, as illustrated in FIG. 16, in the clean room CR, the individually manufactured wafers $W_{MCAE}$ and $W_{PCE}$ are bonded together (Step S22). For example, as illustrated in FIG. 17, the chip $C_{ME}$ and the chip $C_{PE}$ are bonded together via the plurality of first internal electrodes $P_{f1}$ and the plurality of second internal electrodes $P_{f1}$. In the comparative example, the processes up to Steps S21 and S22 are performed in the clean room CR.

Next, a die sort test is performed on the wafers $W_{MCAE}$, $W_{PCE}$ bonded together in Step S22 (Step S23). Dicing is performed on the chips $C_{ME}$, $C_{PE}$ (Step S24).

Next, a memory device including the chips $C_{ME}$, $C_{PE}$ is mounted to the upper surface of the package substrate, thereby electrically connecting the memory device to the package substrate (Step S25). At this time, the controller die is also mounted to the upper surface of the package substrate.

Next, the plurality of memory devices (chips $C_{ME}$, $C_{PE}$) and the controller die on the package substrate are molded (Step S26). Then, dicing of the semiconductor package PG1 is performed (Step S27).

Subsequently, a test of the semiconductor package PG1 is performed (Step S28), and the semiconductor package PG1 is shipped (Step S29).

Effects of First Embodiment

In the first embodiment, since the test is separately performed on the chip $C_M$ in the memory cell array MCA side and the chip $C_P$ in the peripheral circuit PC side, the memory device MD can be completed by combining the highly reliable chips (chips with excellent properties). Since the chip $C_M$ is connected to the chip $C_P$ via the bump electrode $B_C$, and the two memory devices MD are mutually connected via the bump electrode $B_{MD}$, the connections between the chips and between the memory devices MD can be facilitated. Since the memory devices MD are mutually electrically connected by the electrodes $C_{TSV1}$, $C_{TSV2}$ and the bump electrode $B_{MD}$, the signal can be input and output at a high speed compared with a case where the memory devices MD are mutually electrically connected by a bonding wire.

Second Embodiment

[Configuration of Semiconductor Package PG2]

Figure 18:
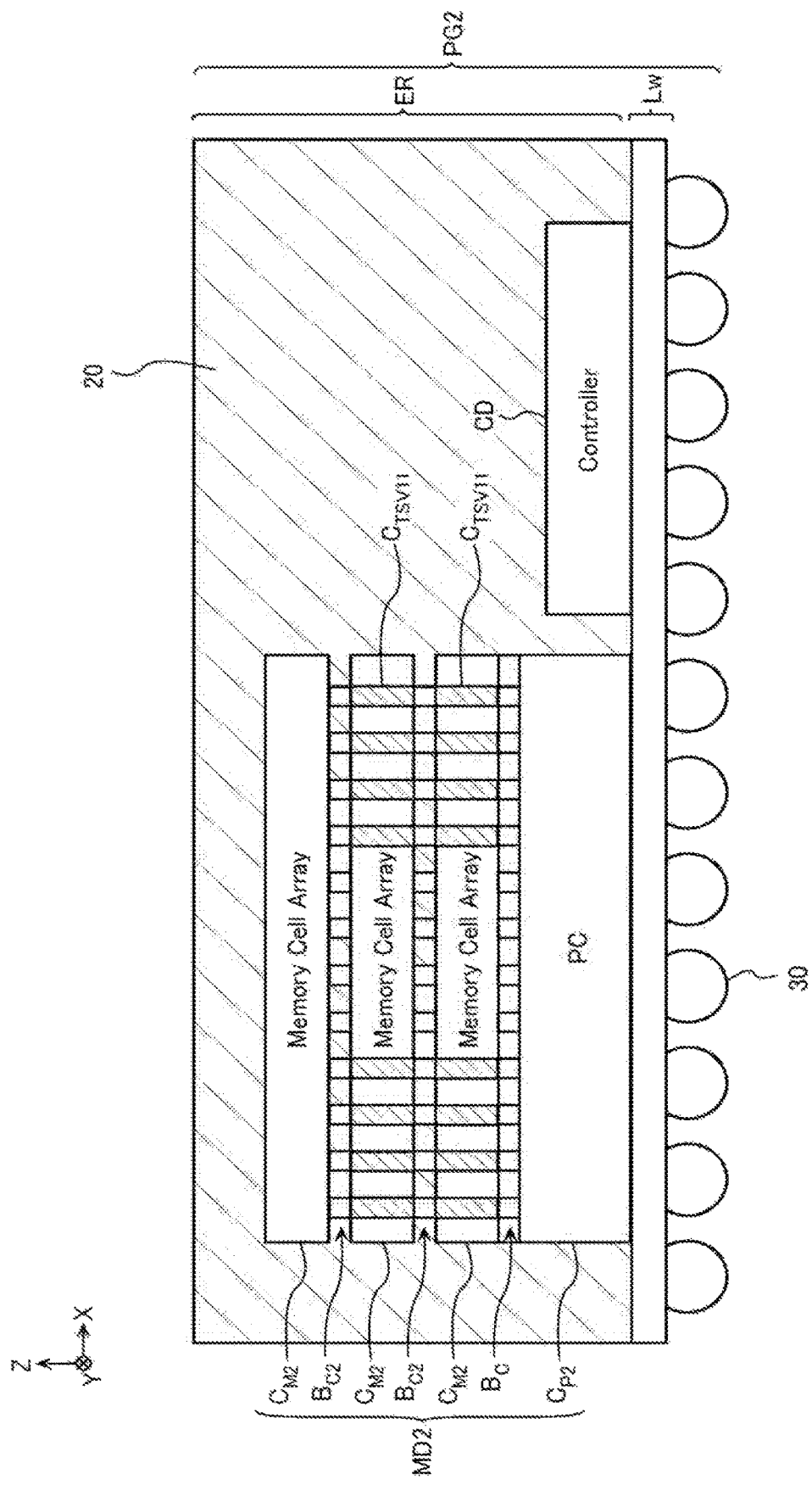
FIG. 18 is a schematic cross-sectional view of a semiconductor package PG2 according to a second embodiment.

FIG. 18 is a schematic cross-sectional view of a semiconductor package PG2. In FIG. 18, the same reference numerals are attached to the configurations the same as the configurations of FIG. 1, and the explanation will be omitted.

The semiconductor package PG2 includes a rewiring layer Lw, a memory device MD2, a controller die CD, a sealing resin 20, and a plurality of solder balls 30.

The rewiring layer Lw electrically connects between the memory device MD2, the controller die CD, an external terminal, and the like. The plurality of solder balls 30 are attached to a lower surface of the rewiring layer Lw.

The memory device MD2 includes a plurality of chips $C_{M2}$ each including a memory cell array, and one chip $C_{P2}$ including a peripheral circuit PC. In the example of FIG. 18, the memory device MD2 includes the three chips $C_{M2}$ and the one chip $C_{P2}$. The memory device MD2 includes bump electrodes $B_C$ disposed between the chip $C_{P2}$ and the chip $C_{M2}$, and bump electrode $B_{C2}$ disposed between the two chips $C_{M2}$.

The chip $C_{M2}$ is basically configured similarly to the chip $C_M$. However, the chip $C_{M2}$ includes a plurality of first electrodes $C_{TSV11}$ instead of the plurality of first electrodes $C_{TSV1}$. The first electrode $C_{TSV11}$ is configured similarly to the first electrode $C_{TSV1}$.

In FIG. 18, the first electrodes $C_{TSV11}$ in the chip $C_{M2}$ of a third stage (uppermost) are not illustrated. However, the first electrodes $C_{TSV11}$ may be disposed in the chip $C_{M2}$.

The chip $C_{P2}$ is basically configured similarly to the chip $C_P$. However, the peripheral circuit PC of the chip $C_P$ is connected to the memory cell array in one chip $C_M$. Meanwhile, the peripheral circuit PC of the chip $C_{P2}$ is connected to the memory cell arrays in a plurality of (in the illustrated example, three) chips $C_{M2}$. The chip $C_{P2}$ may include a electrode (second electrode $C_{TSV2}$ of FIG. 1), or need not include the electrode.

The plurality of bump electrodes $B_C$ have the configuration the same as that of the plurality of bump electrodes $B_C$ illustrated in FIG. 1, FIG. 5, and FIG. 6. The plurality of bump electrodes $B_C$ electrically connect paths of the wirings and the like in the chip $C_{M2}$ of a first stage (lowermost) to paths of the wirings and the like in the chip $C_{P2}$. Accordingly, a signal is transmitted between the memory cell array of the chip $C_{M2}$ of the first stage and the peripheral circuit PC of the chip $C_{P2}$.

A plurality of the bump electrodes $B_{C2}$ electrically connect the plurality of first electrodes $C_{TSV11}$ in one chip $C_{M2}$ to the plurality of first electrodes $C_{TSV11}$ in the other chip $C_{M2}$. Accordingly, a signal is transmitted between the memory cell array of the chip $C_{M2}$ (for example, chips $C_{M2}$ of second stage and third stage) other than the chip $C_{M2}$ of the first stage and the peripheral circuit PC of the chip $C_{P2}$.

The memory device MD2 is electrically connected to the controller die CD via wirings in the rewiring layer Lw. Accordingly, a signal is transmitted between the peripheral circuit PC of the chip $C_{P2}$ and the controller die CD.

[Method of Manufacturing Semiconductor Package PG2]

Next, a method of manufacturing the semiconductor package PG2 will be described with reference to FIG. 19 to FIG. 24.

Figure 19:
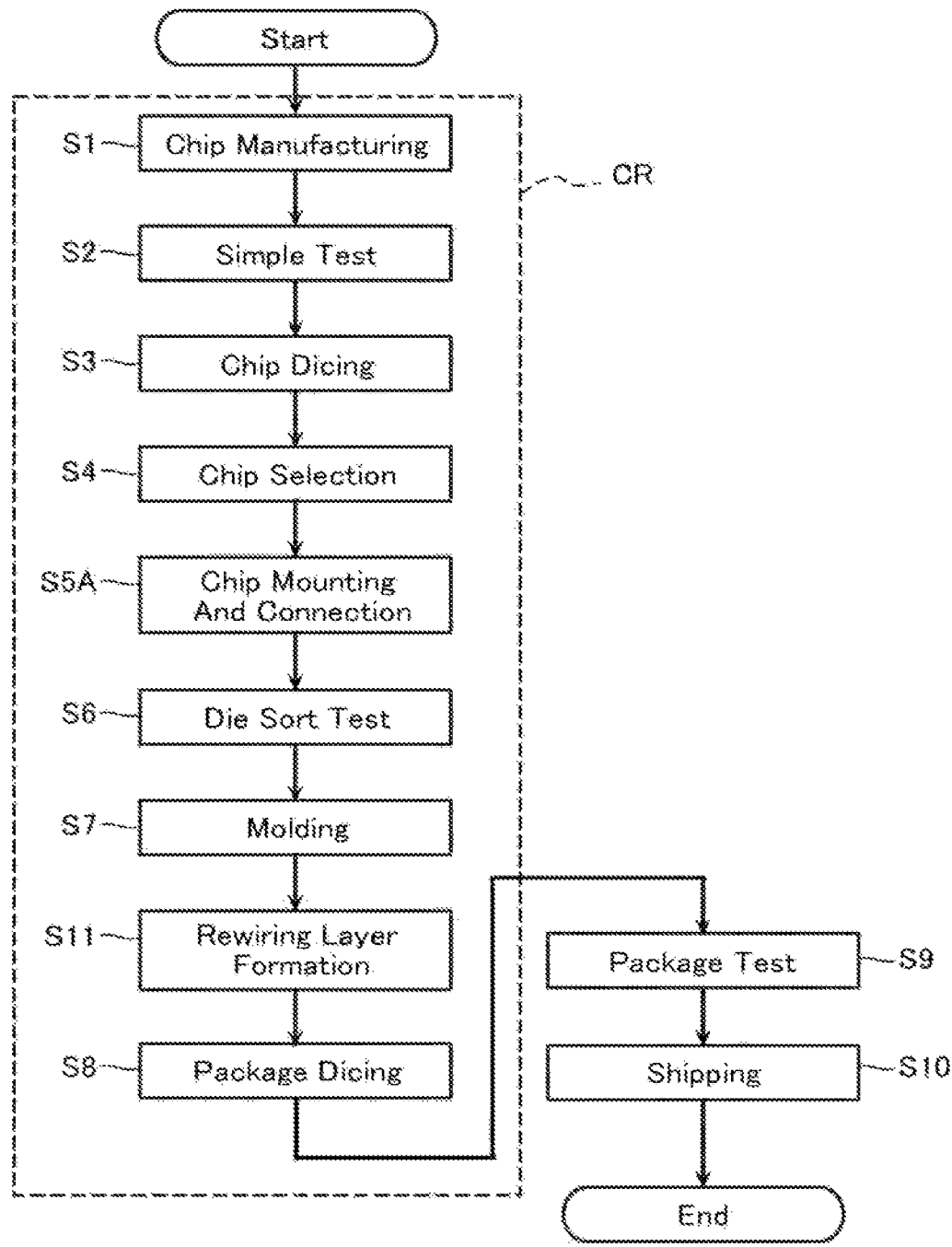
FIG. 19 is a flowchart for describing a method of manufacturing the semiconductor package PG2 according to the second embodiment.

FIG. 19 is a flowchart for describing the method of manufacturing the semiconductor package PG2. FIG. 20 to FIG. 24 are schematic cross-sectional views for describing the method of manufacturing the semiconductor package PG2. "CR" in FIG. 19 means a clean room.

Steps S1 to S4 of FIG. 19 are similar to Steps S1 to S4 of FIG. 9. However, a plurality of the chips $C_{M2}$ are formed on the wafer $W_{MCA}$, and a plurality of the chips $C_{P2}$ are formed on the wafer $W_{PC}$.

Figure 20:
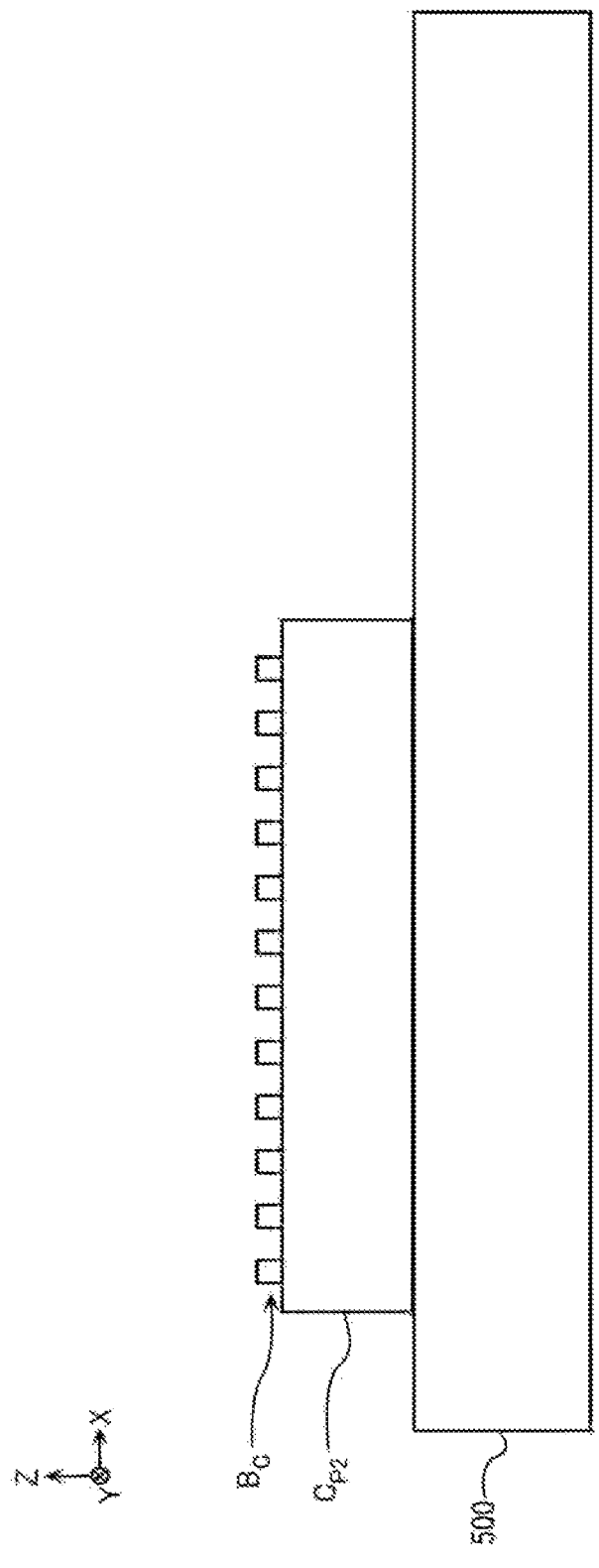
FIG. 20 is a schematic cross-sectional view for describing the method of manufacturing the semiconductor package PG2.

Next, in Step S5A, the chips $C_{M2}$, $C_{P2}$ are mounted, and the chips $C_{M2}$, $C_{P2}$ are mutually connected. For example, as illustrated in FIG. 20, the chip $C_{P2}$ is mounted to an upper surface of a support wafer 500. As the support wafer 500, for example, a glass wafer is used.

Figure 21:
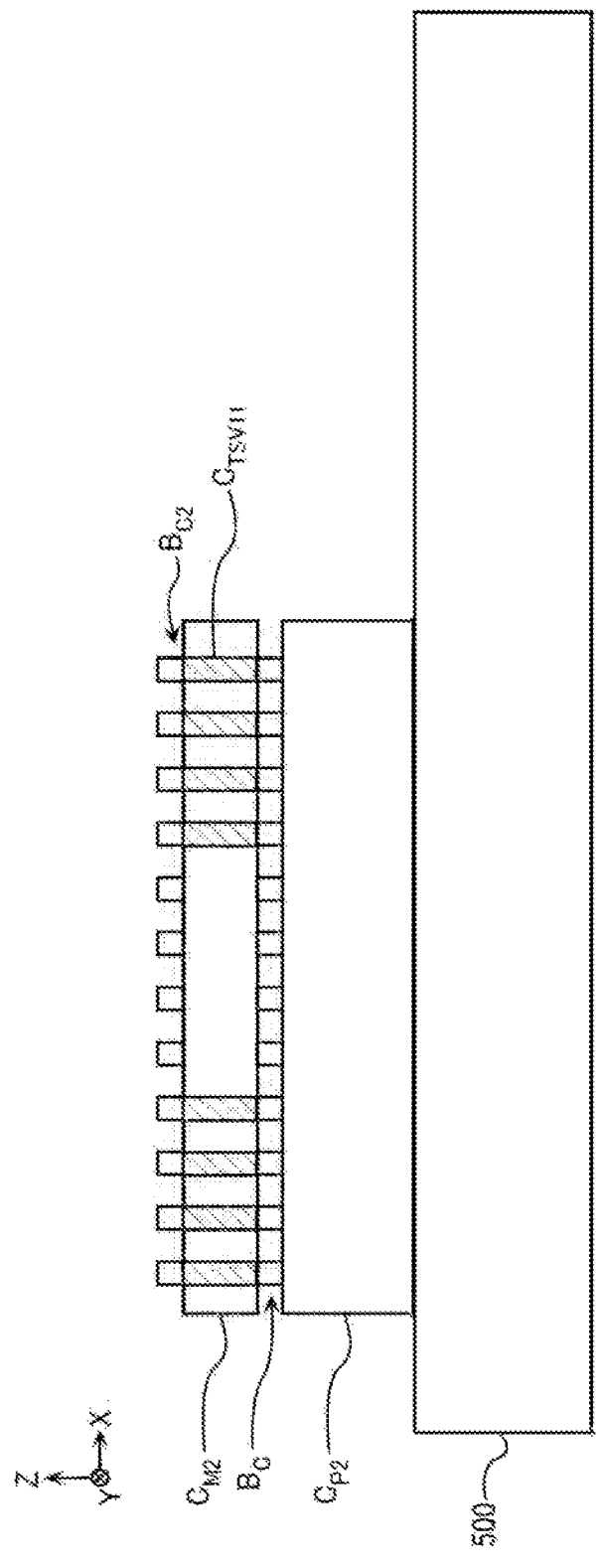
FIG. 21 is a schematic cross-sectional view for describing the manufacturing method.
Figure 22:
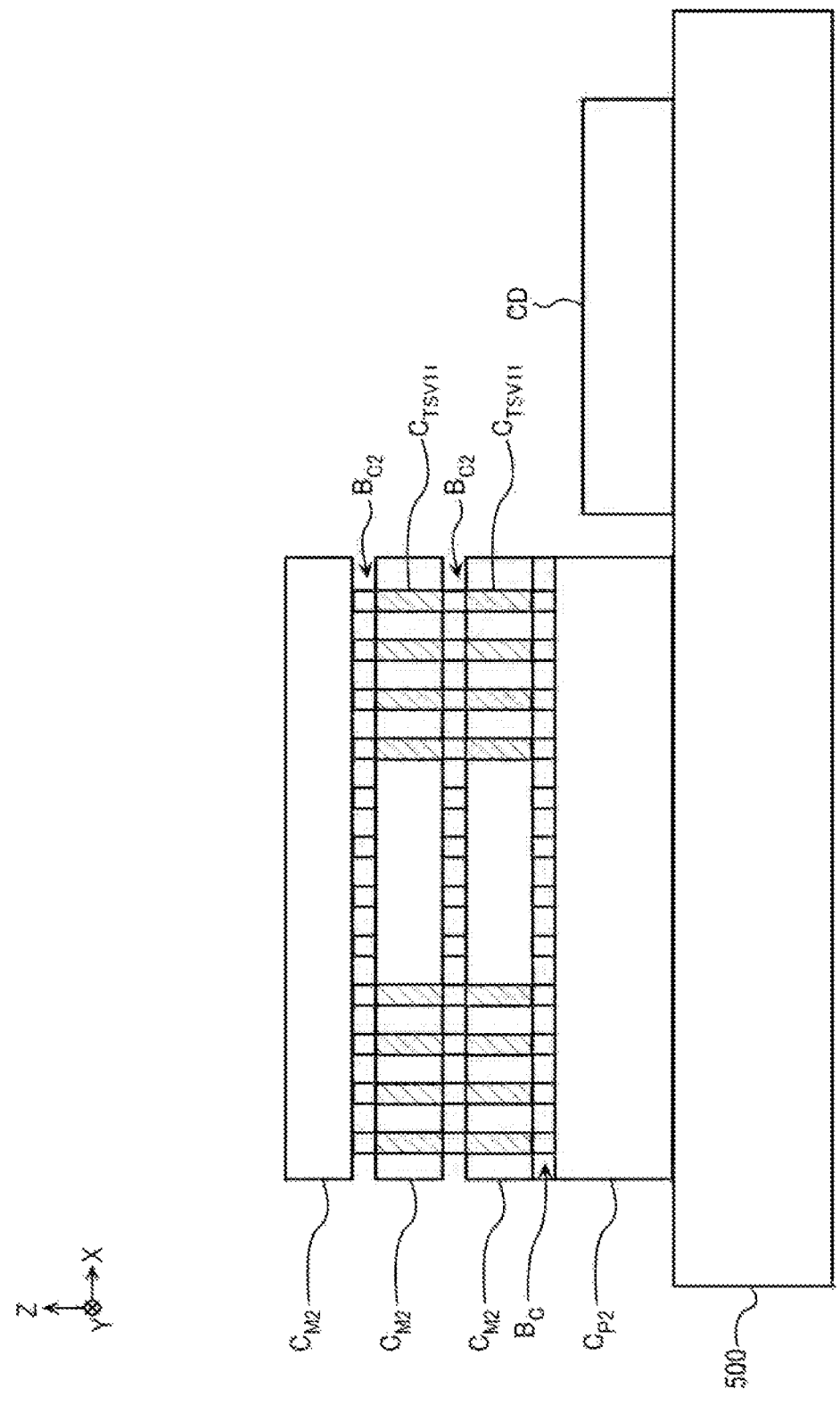
FIG. 22 is a schematic cross-sectional view for describing the manufacturing method.

As illustrated in FIG. 21, the chip $C_{M2}$ is mounted above the chip $C_{P2}$ via the plurality of bump electrodes $B_C$. At this time, the chip $C_{M2}$ is electrically connected to the bump electrodes $B_C$. For example, as illustrated in FIG. 22, the chip $C_{M2}$ of the second stage is mounted above the chip $C_{M2}$ of the first stage via the plurality of bump electrodes $B_{C2}$. At this time, the chip $C_{M2}$ of the second stage is electrically connected to the bump electrodes $B_{C2}$. Similarly, the chip $C_{M2}$ of the third stage is mounted above the chip $C_{M2}$ of the second stage via the plurality of bump electrodes $B_{C2}$. At this time, the chip $C_{M2}$ of the third stage is electrically connected to the bump electrodes $B_{C2}$. The controller die CD is mounted to the upper surface of the support wafer 500.

Figure 23:
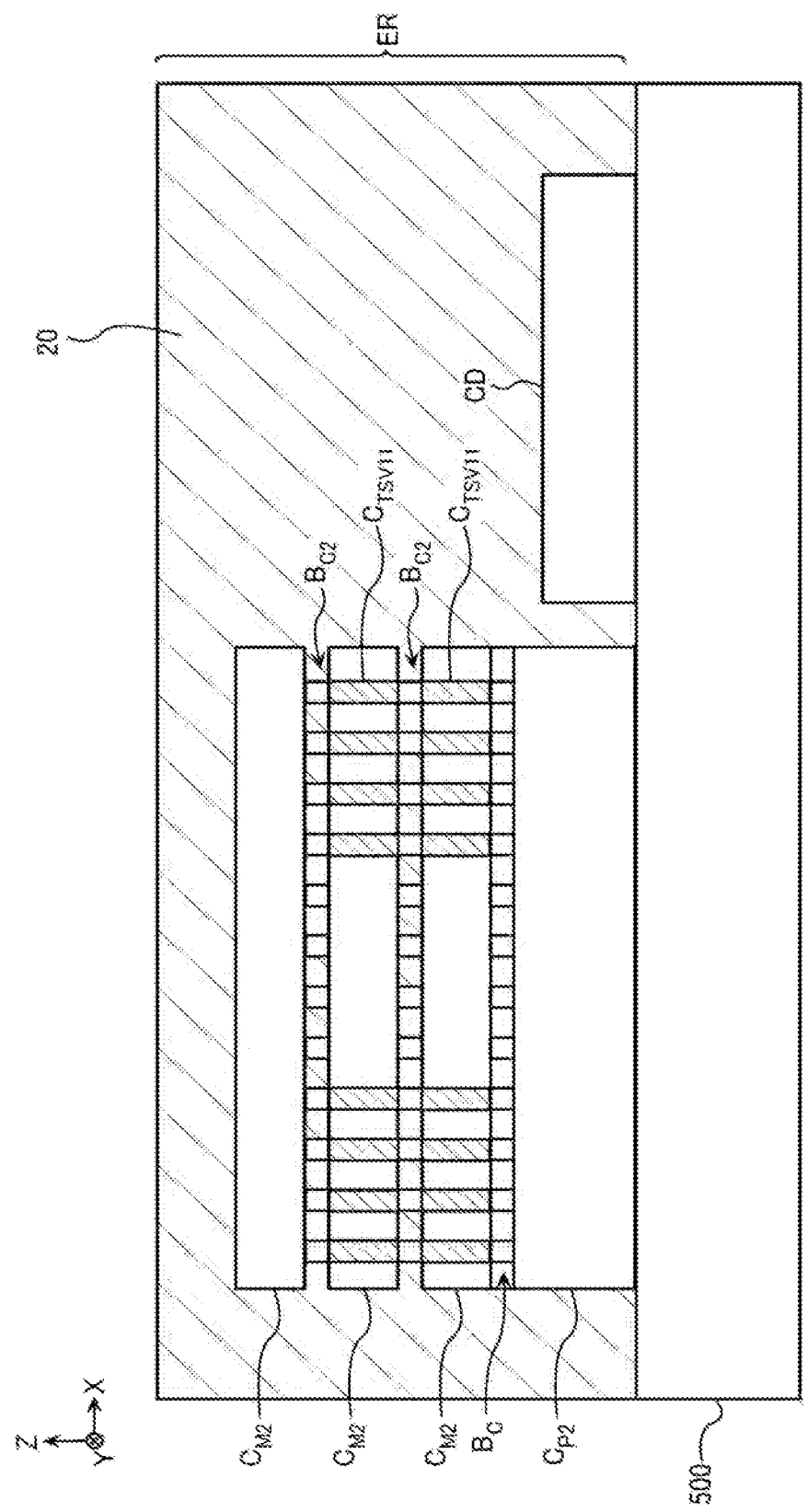
FIG. 23 is a schematic cross-sectional view for describing the manufacturing method.

Next, similarly to the case described using FIG. 9, a die sort test is performed (Step S6). For example, as illustrated in FIG. 23, the memory device MD2 (chips $C_{M2}$, $C_{P2}$) and the controller die CD on the support wafer 500 are molded (Step S7). At this time, a region between the two chips $C_{M2}$, $C_{P2}$ (region in which bump electrodes $B_C$ are disposed) and a region between the two chips $C_{M2}$ (region in which bump electrodes $B_{C2}$ are disposed) are also molded by the sealing resin 20.

Figure 24:
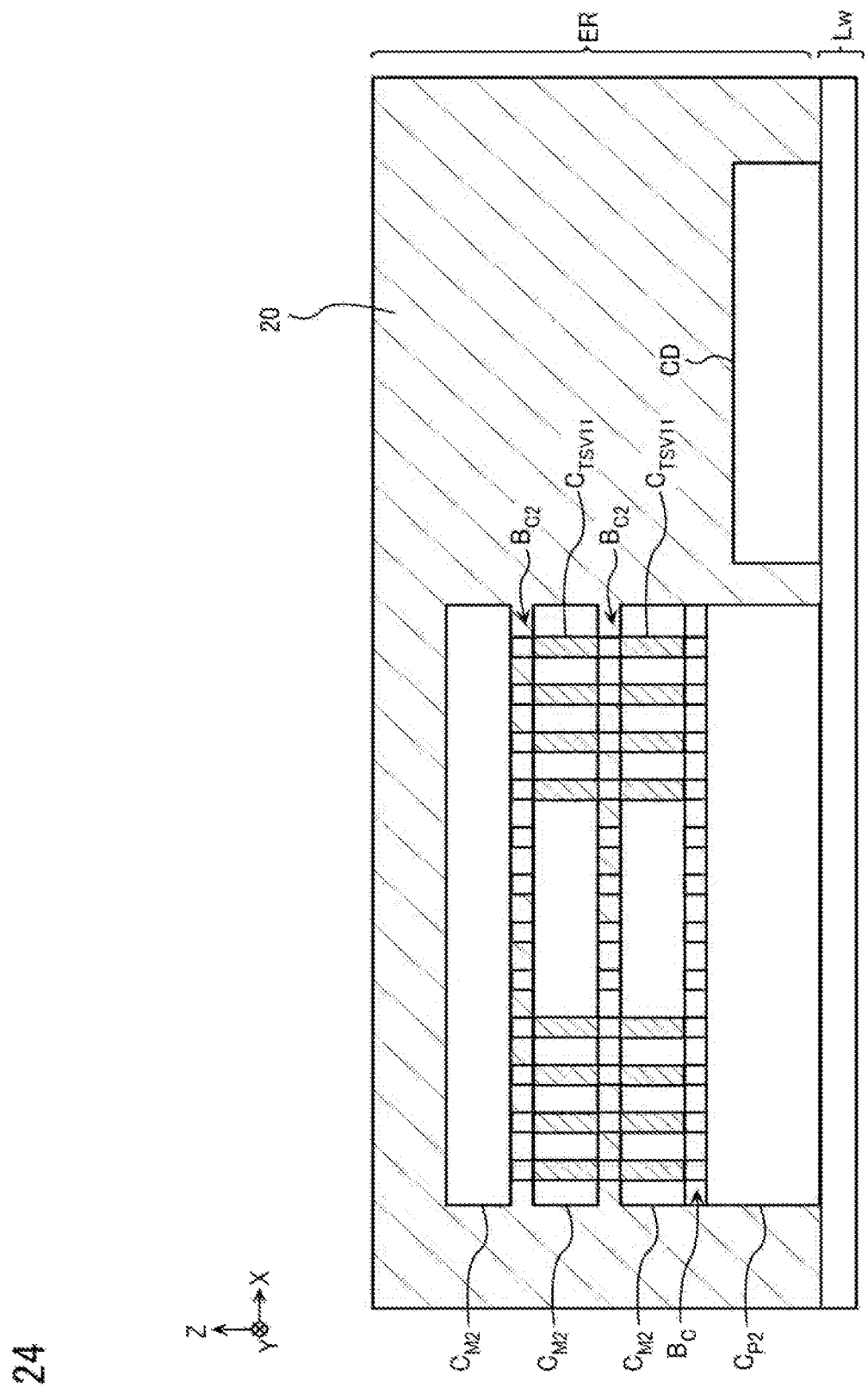
FIG. 24 is a schematic cross-sectional view for describing the manufacturing method.

Next, the rewiring layer Lw is formed (Step S11). For example, as illustrated in FIG. 24, the support wafer 500 is peeled off from the lower surface of the memory device MD2 (chip $C_{P2}$). Then, the rewiring layer Lw is formed on the lower surface of the memory device MD2. In this process, the semiconductor manufacturing equipment performs manufacturing processes of film formation, masking, exposure, developing, etching, and the like on a lower surface of the region ER. Thus, a technique of producing the rewiring layer Lw by using the manufacturing process of the semiconductor memory device is referred to as Fan Out-Wafer Level Package (FO-WLP) in some cases. Using FO-WLP eliminates the need for the package substrate PS of the first embodiment, thus allowing to thin the semiconductor package. The wiring length is shortened, thus making the signal transmission faster.

Next, a plurality of the solder balls 30 are attached to the lower surface of the rewiring layer Lw.

Next, dicing of the semiconductor package PG2 is performed (Step S8). In this embodiment, the processes from Steps S1 to S4, S5A, S6, S7, and S11 are performed in the clean room CR.

Then, a test of the semiconductor package PG2 is performed (Step S9), and the semiconductor package PG2 is shipped (Step S10).

Third Embodiment

[Structures of Chip $C_{M3}$ and Chip $C_{P3}$]

Figure 25:
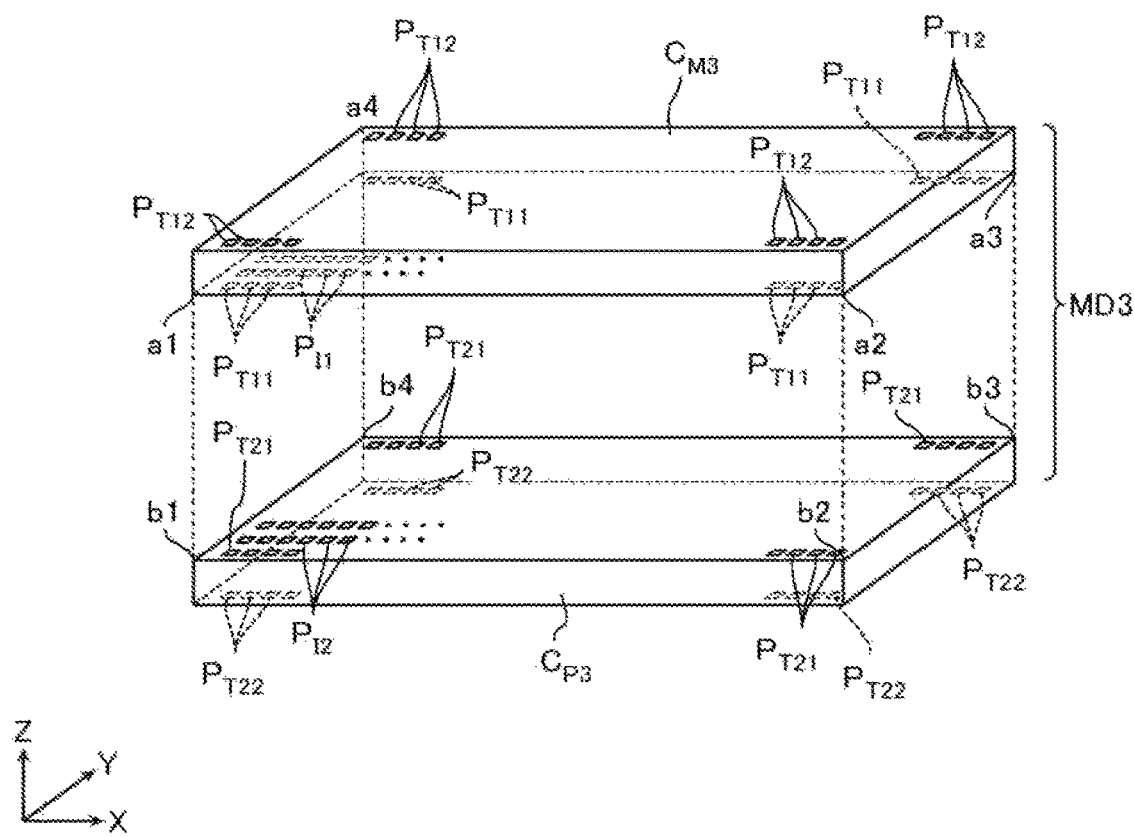
FIG. 25 is a schematic exploded perspective view illustrating an exemplary configuration of a memory device MD3 according to a third embodiment.
Figure 26:
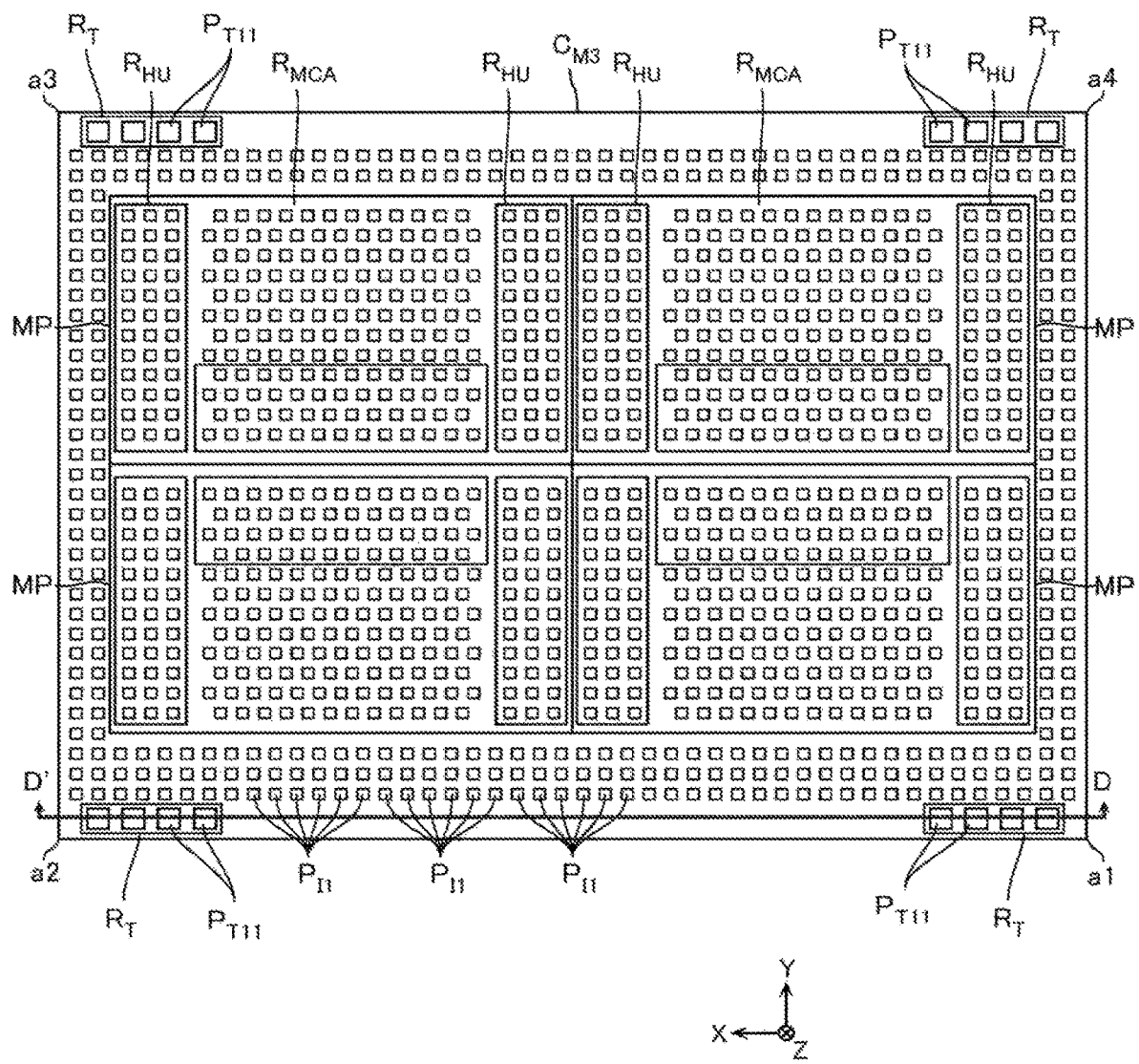
FIG. 26 is a schematic bottom view illustrating an exemplary configuration of a chip $C_{M3}$.
Figure 27:
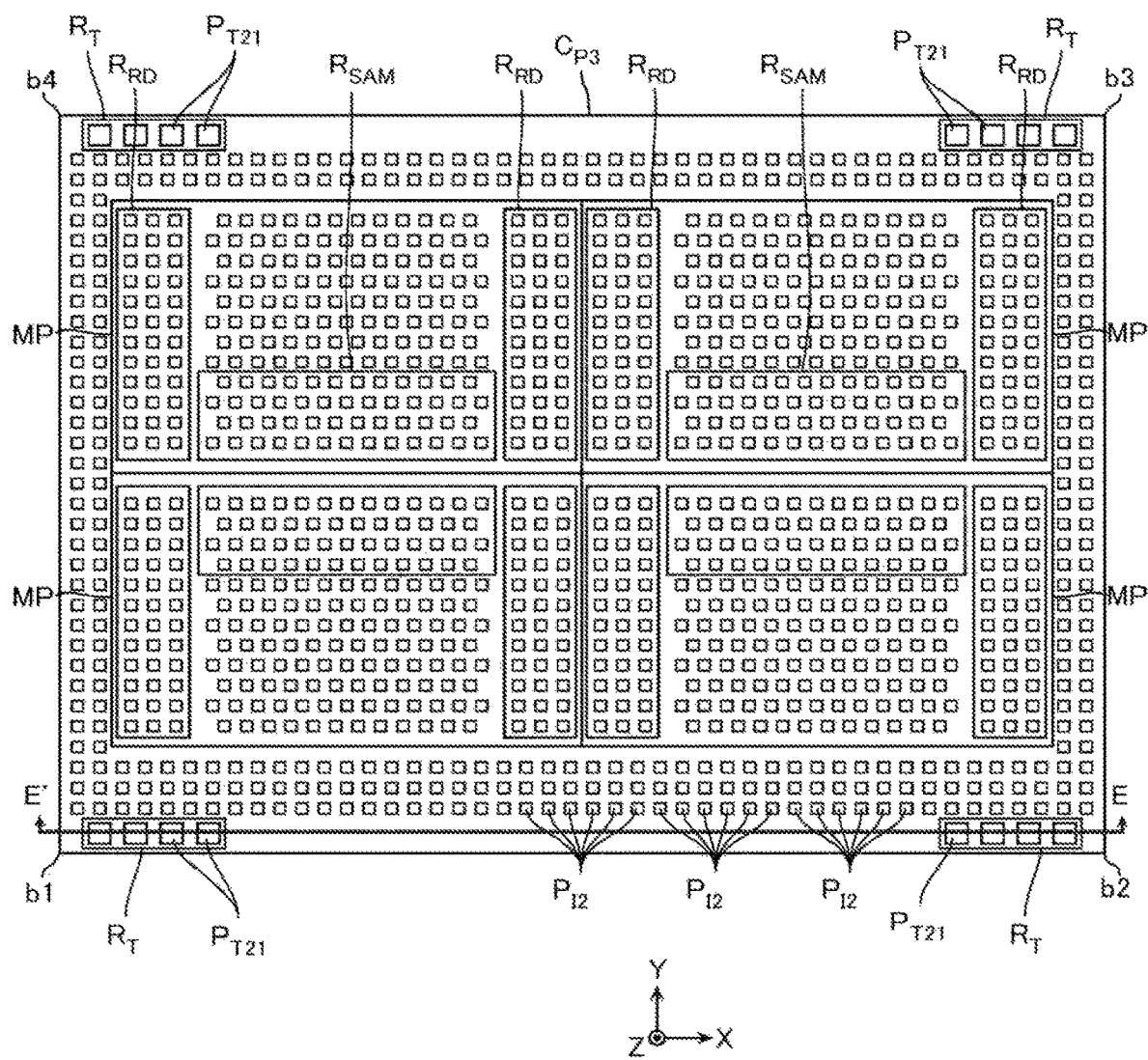
FIG. 27 is a schematic plan view illustrating an exemplary configuration of a chip $C_{P3}$.
Figure 28:
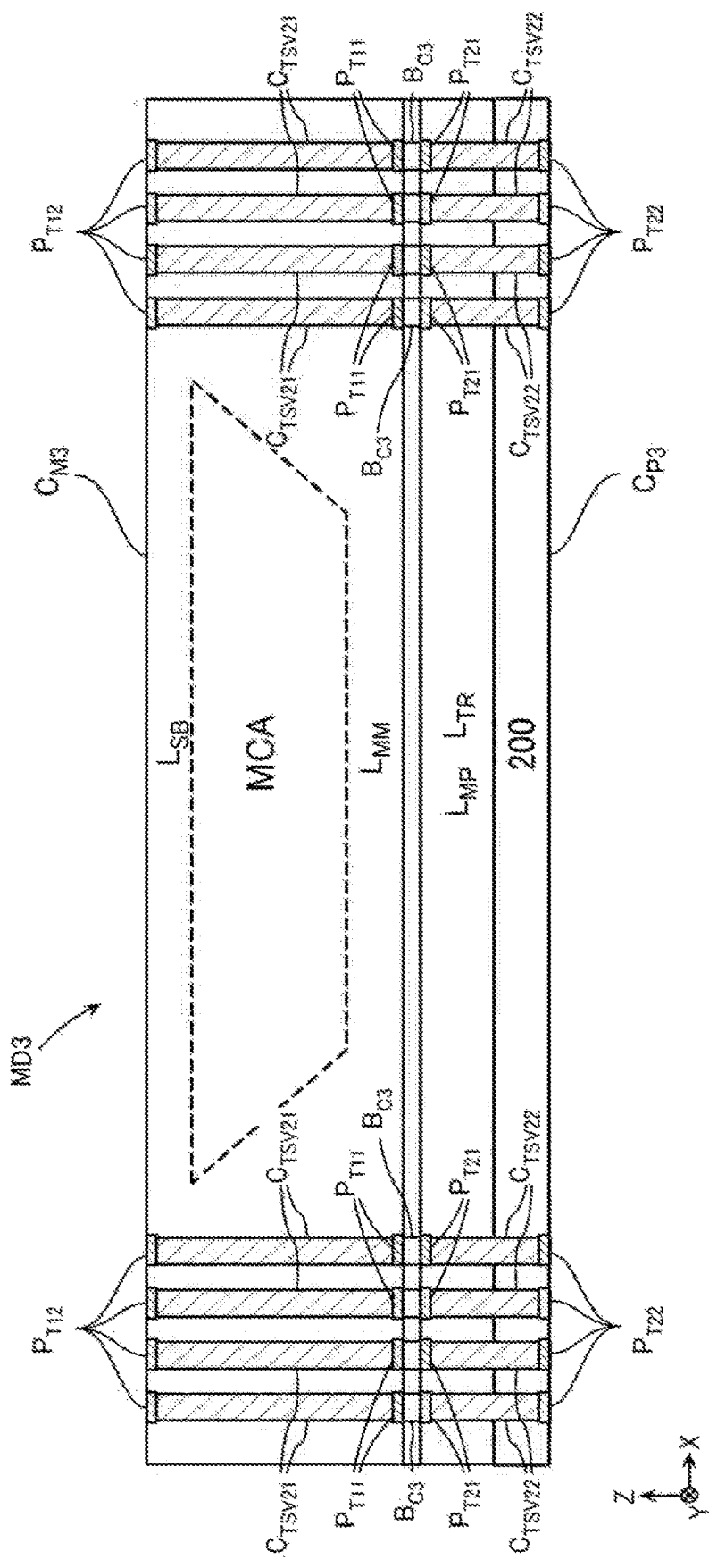
FIG. 28 is a schematic cross-sectional view corresponding to a line D-D' of FIG. 26 and a line E-E' of FIG. 27.

FIG. 25 is a schematic exploded perspective view illustrating an exemplary configuration of a memory device MD3 according to the third embodiment. FIG. 26 is a schematic bottom view illustrating an exemplary configuration of a chip $C_{M3}$. FIG. 27 is a schematic plan view illustrating an exemplary configuration of a chip $C_{P3}$. FIG. 28 is a schematic cross-sectional view corresponding to a line D-D' of FIG. 26 and a line E-E' of FIG. 27. FIG. 28 illustrates a cross section when the structures illustrated in FIG. 26 and FIG. 27 are taken along the respective lines and viewed in arrow directions. In FIG. 25 to FIG. 27, the same reference numerals are attached to the configurations the same as the configurations of FIG. 2 to FIG. 4, and the explanation will be omitted.

A semiconductor package according to the third embodiment is basically configured similarly to the semiconductor package PG1 according to the first embodiment. However, the semiconductor package according to the third embodiment includes a memory device MD3 instead of the memory device MD. As illustrated in FIG. 25, the memory device MD3 includes a chip $C_{M3}$ including a memory cell array, and a chip $C_{P3}$ including a peripheral circuit PC. The chips $C_{M3}$, $C_{P3}$ are basically configured similarly to the chips $C_M$, $C_P$.

However, for example, as illustrated in FIG. 26, in the proximities of the corner portions a1, a2, a3, and a4 in the front surface side of the chip $C_{M3}$, respective external electrode regions $R_T$ are disposed. The four external electrode regions $R_T$ each include a plurality of third internal electrodes $P_{T11}$ instead of the plurality of first internal electrodes $P_{T1}$. Also in the proximities of the corner portions a1, a2, a3, and a4 in the back surface side of the chip $C_{M3}$, respective external electrode regions $R_T$ are disposed. For example, as illustrated in FIG. 25, these external electrode regions $R_T$ each include a plurality of third external electrodes $P_{T12}$ instead of the plurality of first external electrodes $P_{T1}$. The third internal electrode $P_{T11}$ and the third external electrode $P_{T12}$ are basically configured similarly to the first internal electrode $P_{T1}$ and the first external electrode $P_{T1}$.

For example, as illustrated in FIG. 27, in the proximities of the corner portions b1, b2, b3, and b4 in the front surface side of the chip $C_{P3}$, respective external electrode regions $R_T$ are disposed. The four external electrode regions $R_T$ each include a plurality of fourth internal electrodes $P_{T21}$ instead of the plurality of second internal electrodes $P_{T2}$. Also in the proximities of the corner portions b1, b2, b3, and b4 in the back surface side of the chip $C_{P3}$, respective external electrode regions $R_T$ are disposed. These external electrode regions $R_T$ each include a plurality of fourth external electrodes $P_{T22}$ instead of the plurality of second external electrodes $P_{T2}$. The fourth internal electrode $P_{T21}$ and the fourth external electrode $P_{T22}$ are basically configured similarly to the second internal electrode $P_{T2}$ and the second external electrode $P_{T2}$.

In the illustrated example, the external electrode regions $R_T$ are provided in the proximities of the corner portions of the chips $C_{M3}$, $C_{P3}$. However, this configuration is merely an example, and the specific configuration can be appropriately adjusted.

The chip $C_{M3}$ includes a plurality of first electrodes $C_{TSV21}$ instead of the plurality of first electrodes $C_{TSV1}$. The chip $C_{P3}$ includes a plurality of second electrodes $C_{TSV22}$ instead of the plurality of second electrodes $C_{TSV2}$. The plurality of first electrodes $C_{TSV21}$ are basically configured similarly to the plurality of first electrodes $C_{TSV1}$. The plurality of second electrodes $C_{TSV22}$ are basically configured similarly to the plurality of second electrodes $C_{TSV2}$.

For example, as illustrated in FIG. 28, the memory device MD3 includes a plurality of bump electrodes $B_{C3}$ disposed between the chip $C_{P3}$ and the chip $C_{M3}$. The bump electrodes $B_{C3}$ electrically connect the chip $C_{P3}$ to the chip $C_{M3}$. Although not illustrated in FIG. 28, the memory device MD3 also includes the bump electrodes $B_C$ of the first embodiment. The plurality of bump electrodes $B_{C3}$ are disposed in the region in which the plurality of bump electrodes $B_C$ are disposed (external electrode region $R_T$ (FIG. 26 and FIG. 27) different from regions $R_C$, $R_P$ of FIG. 3, FIG. 4, and FIG. 6). The bump electrode $B_{C3}$ has a size larger than the size of the bump electrode $B_C$.

The plurality of bump electrodes $B_{C3}$ electrically connect the plurality of first electrodes $C_{TSV21}$ of the chip $C_{M3}$ to the plurality of second electrodes $C_{TSV22}$ of the chip $C_{P3}$ in one memory device MD3. In the third embodiment also, similarly to the first embodiment, the plurality of bump electrodes $B_{MD}$ electrically connect the plurality of first electrodes $C_{TSV21}$ of the chip $C_{M3}$ in one memory device MD3 to the plurality of second electrodes $C_{TSV22}$ in another memory device MD3. Thus, the controller die CD is electrically connected to the peripheral circuit PC of the chip Cn via the first electrode $C_{TSV21}$ and the second electrode $C_{TSV22}$. Accordingly, a signal is transmitted between the peripheral circuit PC of the chip Cn and the controller die CD.

Fourth Embodiment

Figure 29:
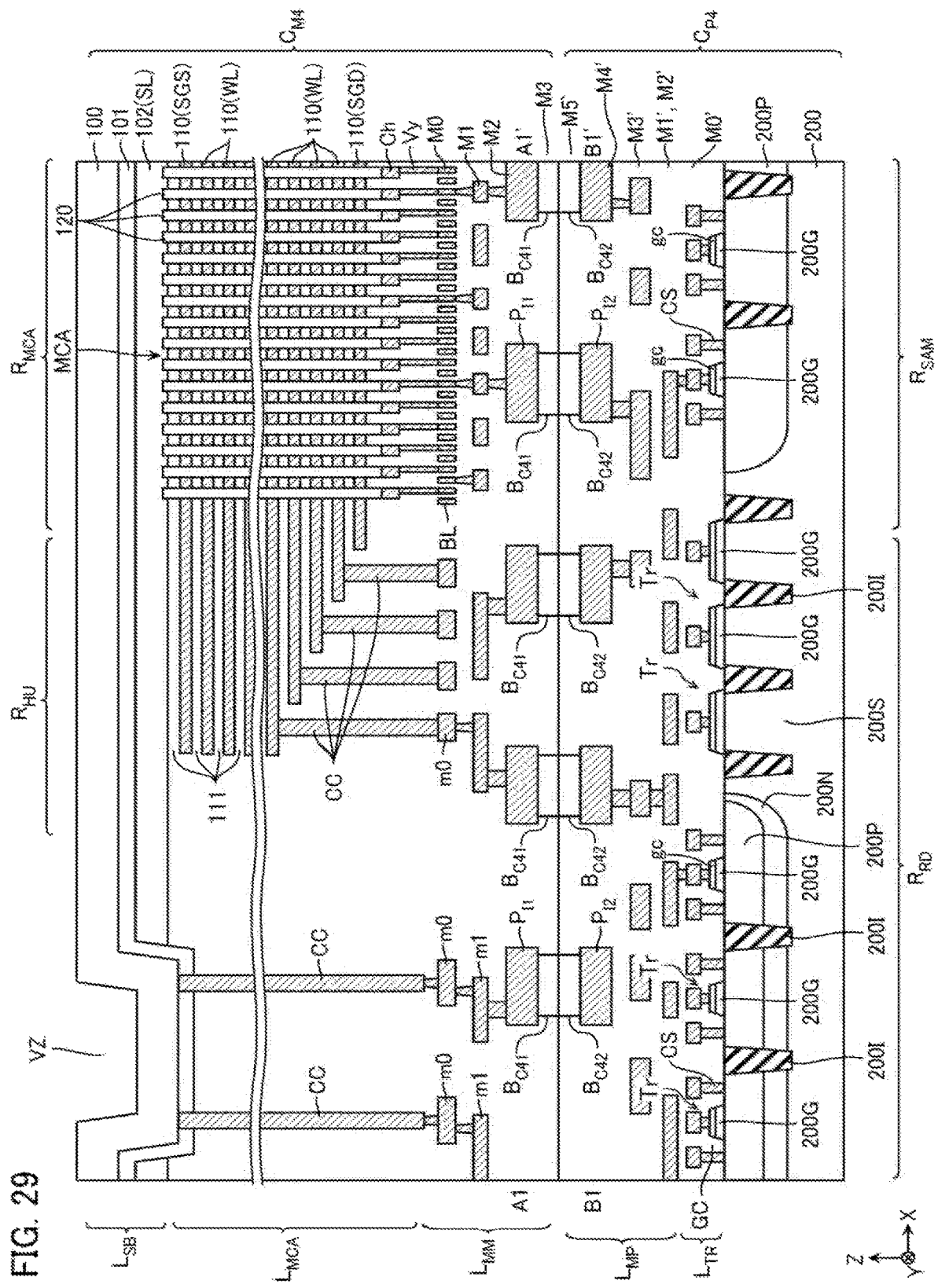
FIG. 29 is a schematic cross-sectional view illustrating an exemplary configuration of a memory device MD4 according to a fourth embodiment.
Figure 30:
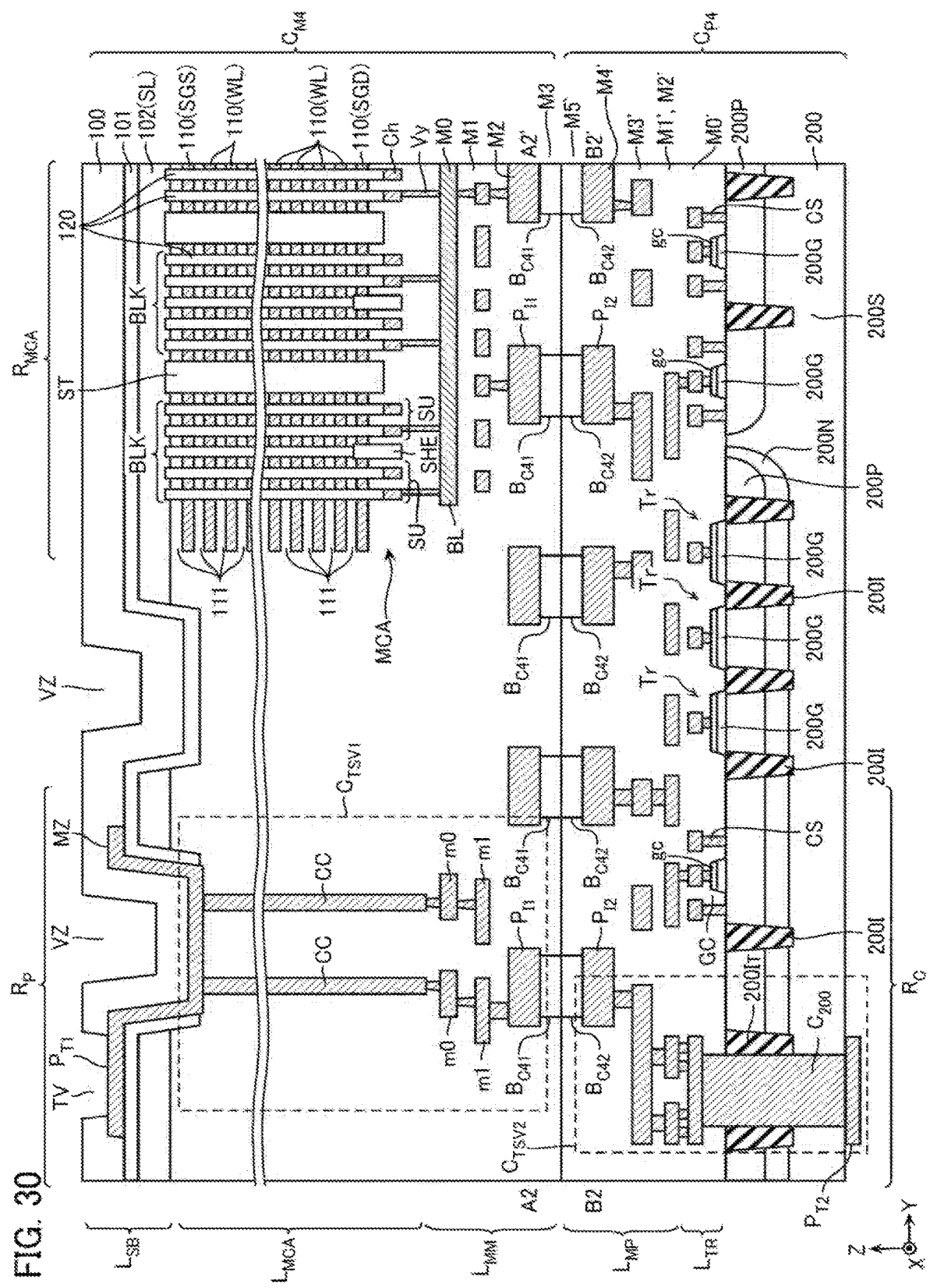
FIG. 30 is a schematic cross-sectional view illustrating an exemplary configuration of the memory device MD4 according to the fourth embodiment.
Figure 31:
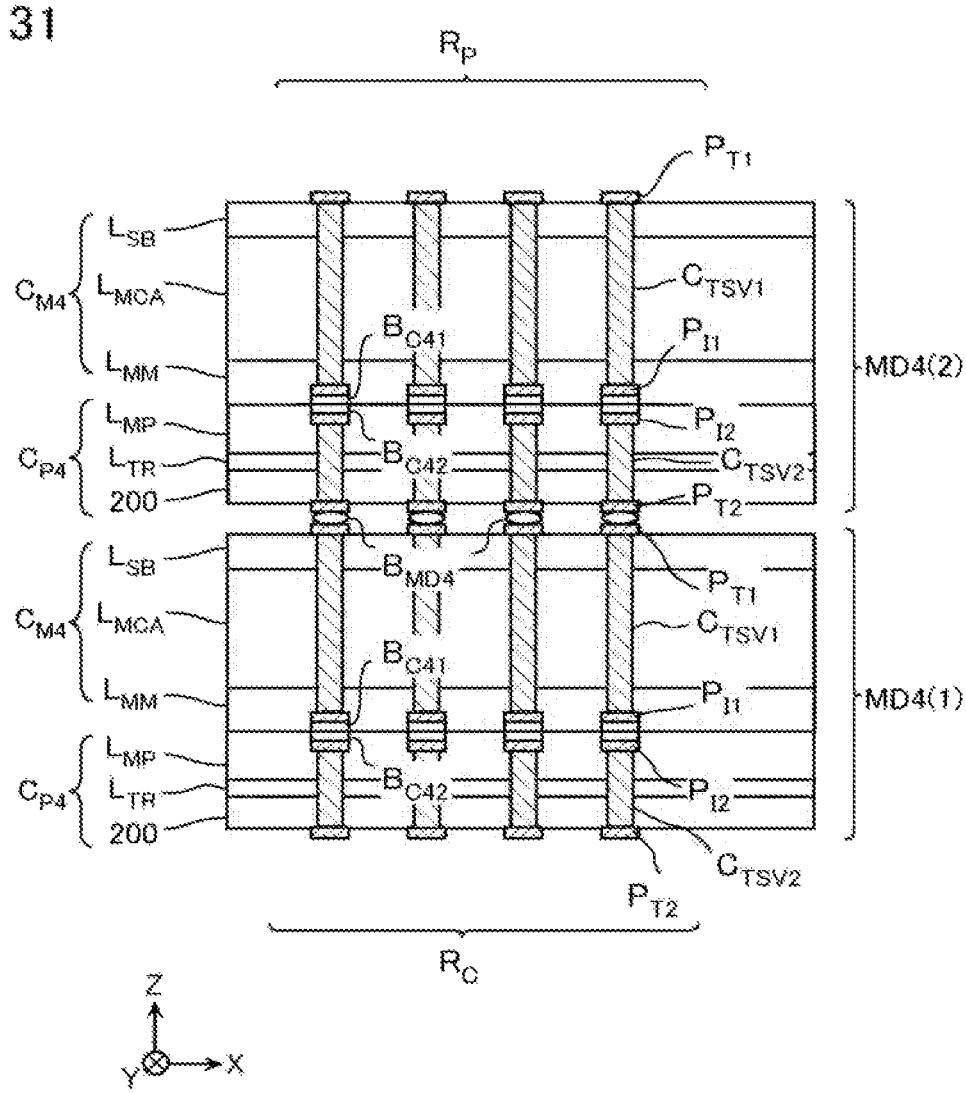
FIG. 31 is a schematic cross-sectional view for describing a connection between the memory devices MD4 by bump electrodes $B_{MD4}$.

FIG. 29 and FIG. 30 are schematic cross-sectional views illustrating an exemplary configuration of a memory device MD4 according to a fourth embodiment. FIG. 31 is a schematic cross-sectional view for describing a connection between the memory devices MD4 by bump electrodes $B_{MD4}$. FIG. 29 is a drawing corresponding to FIG. 5, FIG. 30 is a drawing corresponding to FIG. 6, and FIG. 31 is a drawing corresponding to FIG. 8. In FIG. 29 to FIG. 31, the same reference numerals are attached to the configurations the same as the configurations of FIG. 5, FIG. 6, and FIG. 8, and the explanation will be omitted.

The above-described memory device MD of the first embodiment is provided with a clearance between the chips $C_M$ and $C_P$. The plurality of bump electrodes $B_C$ are disposed in the clearance (FIG. 5 and FIG. 6). Meanwhile, for example, as illustrated in FIG. 29 and FIG. 30, the memory device MD4 of the fourth embodiment is not provided with a clearance between a chip $C_{M4}$ in the memory cell array side and a chip $C_{P4}$ in the peripheral circuit PC side. A plurality of bump electrodes $B_{C41}$ are formed in a wiring layer M3 of the chip $C_{M4}$. The plurality of bump electrodes $B_{C41}$ are connected to a respective plurality of first internal electrodes $P_{T1}$, and do not project from a front surface of the chip $C_{M4}$. A plurality of bump electrodes $B_{C42}$ are formed in a wiring layer M5' of the chip $C_{P4}$. The plurality of bump electrodes $B_{C42}$ are connected to a respective plurality of second internal electrodes $P_{T2}$, and do not project from a front surface of the chip $C_{P4}$. Then, in a state where the front surface of the chip $C_{M4}$ and the front surface of the chip $C_{P4}$ are bonded together, the plurality of bump electrodes $B_{C41}$ are electrically connected to the respective plurality of bump electrodes $B_{C42}$.

For example, the plurality of bump electrodes $B_{C41}$ are formed on the respective plurality of first internal electrodes $P_{T1}$. The plurality of bump electrodes $B_{C41}$ are covered with an insulating material. Then, the front surface of the chip $C_{M4}$ is ground. The plurality of bump electrodes $B_{C42}$ are formed on the respective plurality of second internal electrodes $P_{T2}$. The plurality of bump electrodes $B_{C42}$ are covered with an insulating material. Then, the front surface of the chip $C_{P4}$ is ground. Subsequently, the front surface of the chip $C_{M4}$ and the front surface of the chip $C_{P4}$ are bonded together. At this time, the plurality of bump electrodes $B_{C41}$ are electrically connected to the respective plurality of bump electrodes $B_{C42}$.

For example, as illustrated in FIG. 31, a plurality of first external electrodes $P_{T1}$ of one memory device MD4(1) are electrically connected to a respective plurality of second external electrodes $P_{T2}$ of another memory device MD4(2) via a plurality of bump electrodes $B_{MD4}$. The plurality of bump electrodes $B_{MD4}$ contain, for example, solder. The plurality of bump electrodes $B_{MD4}$ may contain a conductive material other than solder.

Other Embodiment

The semiconductor memory devices and the manufacturing methods according to the first embodiment to the fourth embodiment are described above. However, the configurations of the semiconductor memory devices and the manufacturing methods according to the first embodiment to the fourth embodiment are merely examples, and the specific configuration and manufacturing method can be appropriately adjusted.

For example, in the semiconductor package PG1 of the first embodiment, a rewiring layer Lw may be used instead of the package substrate PS. The shapes of the bump electrodes in the first embodiment to the fourth embodiment may be columnar shapes, and may be ball shapes and the like. While the chip includes the four memory planes MP as illustrated in FIG. 3 and FIG. 4, the chip may include one memory plane MP or two memory planes MP, and may include four or more memory planes MP.

While the semiconductor package PG1 of the first embodiment includes the three memory devices MD(1), MD(2), MD(3), the semiconductor package PG1 of the first embodiment may include two memory devices, and may include four or more memory devices. While the semiconductor package PG2 of the second embodiment includes the three chips $C_{M2}$, the semiconductor package PG2 of the second embodiment may include the two chips $C_{M2}$, and may include the four or more chips $C_{M2}$. The semiconductor package of the third embodiment may include the three memory devices MD3 similarly to the semiconductor package PG1 of the first embodiment. Furthermore, the semiconductor package of the third embodiment may include the two memory devices MD3, and may include the four or more memory devices MD3.

The material of the bump electrodes of the first embodiment to the fourth embodiment also can be appropriately adjusted.

The chips $C_M$, $C_{M2}$, $C_{M3}$, $C_{M4}$ of the first embodiment to the fourth embodiment may each include a semiconductor substrate. In this case, the semiconductor substrate may include a substrate-through electrode. In this case, the first electrodes $C_{TSV1}$, $C_{TSV11}$, $C_{TSV21}$ may each include the substrate-through electrode.

In the methods for manufacturing a semiconductor memory device of the first embodiment and the second embodiment, a part of the steps may be omitted, and the order of a part of the steps may be interchanged. For example, the die sort test of Step S6 may be omitted. The die sort test of Step S6 may be performed after performing the molding in Step S7.

In the method of manufacturing a semiconductor memory device of the second embodiment, the rewiring layer is formed in Step S11 after performing the molding in Step S7. However, the molding in Step S7 may be performed after forming the rewiring layer in Step S11.

The bump electrodes $B_C$, $B_{C2}$ of the second embodiment and the bump electrode $B_{C3}$ of the third embodiment may be configured so as not to project from the front surfaces of the chips $C_{M2}$, $C_{P2}$ of the second embodiment and the front surfaces of the chips $C_{M3}$, $C_{P3}$ of the third embodiment similarly to the bump electrodes $B_{C41}$, $B_{C42}$ of the fourth embodiment.

The bump electrode $B_{MD}$ of the third embodiment may be configured to be the same as the bump electrode $B_{MD4}$ of the first embodiment.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory device and a second memory device arranged in a first direction; and
a plurality of first bump electrodes disposed between the first memory device and the second memory device, wherein
each of the first memory device and the second memory device includes:
a first chip including a memory cell array and a plurality of first electrodes;
a second chip including a peripheral circuit and a plurality of second electrodes; and
a plurality of second bump electrodes disposed between the first chip and the second chip,
the first direction is a thickness direction of the first memory device and the second memory device,
at least one of the plurality of first bump electrodes electrically connects at least one of the plurality of first electrodes included in the first memory device to at least one of the plurality of second electrodes included in the second memory device,
in the first memory device and the second memory device, at least one of the plurality of second bump electrodes electrically connects the memory cell array to the peripheral circuit,
the peripheral circuit of the first memory device is configured to be able to control the memory cell array of the first memory device, and
at least one of the plurality of second bump electrodes of the first memory device is disposed between the peripheral circuit of the first memory device and the memory cell array of the first memory device, and connects the peripheral circuit of the first memory device to the memory cell array of the first memory device in the first direction.

2. The semiconductor memory device according to claim 1, wherein
in the first memory device and the second memory device, at least one of the plurality of second bump electrodes electrically connects at least one of the plurality of first electrodes to at least one of the plurality of second electrodes.

3. The semiconductor memory device according to claim 1, wherein
each of the first memory device and the second memory device includes a plurality of third bump electrodes disposed between the first chip and the second chip, and
in the first memory device and the second memory device, at least one of the plurality of third bump electrodes electrically connects at least one of the plurality of first electrodes to at least one of the plurality of second electrodes.

4. The semiconductor memory device according to claim 3, wherein
in a plane perpendicular to the first direction, the plurality of third bump electrodes are disposed in a region different from a region in which the plurality of second bump electrodes are disposed.

5. The semiconductor memory device according to claim 3, wherein
in a plane perpendicular to the first direction, the third bump electrode has a size larger than a size of the second bump electrode.

6. The semiconductor memory device according to claim 1, wherein
the first bump electrode and the second bump electrode contain mutually different materials.

7. The semiconductor memory device according to claim 1, wherein
in a plane perpendicular to the first direction, the second bump electrode has a size smaller than a size of the first bump electrode.

8. A semiconductor memory device comprising:

two first chips arranged in a first direction, each of the two first chips including a memory cell array and a plurality of electrodes;

a second chip arranged in the first direction together with the two first chips and including a peripheral circuit;

a plurality of first bump electrodes disposed between one of the first chips and the second chip; and a plurality of second bump electrodes disposed between the two first chips, wherein the first direction is a thickness direction of the two first chips and the second chip, at least one of the plurality of first bump electrodes electrically connects the memory cell array of the one of the first chips to the peripheral circuit of the second chip, the plurality of second bump electrodes electrically connect the memory cell array of the other one of the first chips to the peripheral circuit of the second chip by electrically connecting each of the plurality of electrodes of the two first chips, the peripheral circuit of the second chip is configured to be able to control the memory cell arrays of the two first chips, and at least one of the plurality of first bump electrodes is disposed between the memory cell array of the one of the first chips and the peripheral circuit of the second chip, and connects the memory cell array of the one of the first chips to the peripheral circuit of the second chip in the first direction.

9. The semiconductor memory device according to claim 8, wherein the first bump electrode and the second bump electrode contain mutually different materials.

10. The semiconductor memory device according to claim 8, wherein in a plane perpendicular to the first direction, the second bump electrode has a size smaller than a size of the first bump electrode.

* * * * *